(12) United States Patent
Zitlaw et al.

(10) Patent No.: US 11,562,781 B1
(45) Date of Patent: Jan. 24, 2023

(54) MEMORY DEVICES WITH LOW PIN COUNT INTERFACES, AND CORRESPONDING METHODS AND SYSTEMS

(71) Applicant: Infineon Technologies LLC, San Jose, CA (US)

(72) Inventors: Clifford Zitlaw, San Jose, CA (US); Stephan Rosner, Campbell, CA (US); Avi Avanindra, Santa Clara, CA (US)

(73) Assignee: INFINEON TECHNOLOGIES LLC, San Jose, CA (US)

(*) Notice: Subject to any disclaimer, the term of this patent is extended or adjusted under 35 U.S.C. 154(b) by 0 days.

(21) Appl. No.: 17/499,938

(22) Filed: Oct. 13, 2021

(51) Int. Cl.
  *G11C 8/00* (2006.01)
  *G11C 7/22* (2006.01)
  *G11C 7/10* (2006.01)
  *G11C 8/18* (2006.01)

(52) U.S. Cl.
  CPC ............ *G11C 7/222* (2013.01); *G11C 7/1048* (2013.01); *G11C 7/1069* (2013.01); *G11C 7/1096* (2013.01); *G11C 8/18* (2013.01)

(58) Field of Classification Search
  CPC ..... G11C 7/222; G11C 7/1048; G11C 7/1069; G11C 7/1096; G11C 8/18
  USPC ...................................... 365/233.1
  See application file for complete search history.

(56) References Cited

U.S. PATENT DOCUMENTS

| | | | |
|---|---|---|---|
| 2003/0103407 A1* | 6/2003 | Ooishi ............... | G11C 7/1045 365/220 |
| 2018/0012638 A1* | 1/2018 | Kang ................. | G11C 11/4076 |

* cited by examiner

*Primary Examiner* — Huan Hoang

(57) ABSTRACT

A method can include, in an integrated circuit device: at a unidirectional command-address (CA) bus having no more than four parallel inputs, receiving a sequence of no less than three command value portions; latching each command value portion in synchronism with rising edges of a timing clock; determining an input command from the sequence of no less than three command value portions; executing the input command in the integrated circuit device; and on a bi-directional data bus having no more than six data input/outputs (IOs), outputting and inputting sequences of data values in synchronism with rising and falling edges of the timing clock. Corresponding devices and systems are also disclosed.

23 Claims, 28 Drawing Sheets

(BACKGROUND)

| SYMBOL | NAME | TYPE | FUNCTION |
|---|---|---|---|
| CS | Chip Select | Input | Device enable considered part of the command bus |
| CK | Clock | Input | Single ended clock input. The CA bus is sampled on the rising edge of the CK signal (Optional: differential clock). |
| CKE | Clock Enable | Input | Enables CK, input buffers, output buffers |
| CA[2:0] | Command/Add Bus | Input | Defines the command and address information. (Optional: receive calibration data in calibration mode) Function specified by Mode Register settings |
| DQS | Data Strobe | I/O | Data alignment signal. Output during READs and input during WRITEs. (Optional: differential strobe). |
| DMI | Data Mask Inversion | I/O | Multifunction signal:<br>1. Data Masking during WRITE operations<br>2. Data inversion indicator during READ and WRITE operations<br>3. ECC indications during READ and WRITE operations<br>4. Upper, Lower DQ Nibble Indicator<br>Function specified by Mode Register settings |
| DQ[3:0] | Data Bus | I/O | Bi-directional data bus. |
| SUPPORT SIGNALS | | | |
| RESET_n | Bus Reset | Input | Resets interface. |
| ODT(ca) | On Die Termination | Input | Used with Mode Register setting to determine termination state of CA inputs |
| ZQ | Calibration Ref | Ref | Used to calibrate drive strength of IOs and termination value of inputs. |

FIG. 4

(BACKGROUND)

(BACKGROUND)

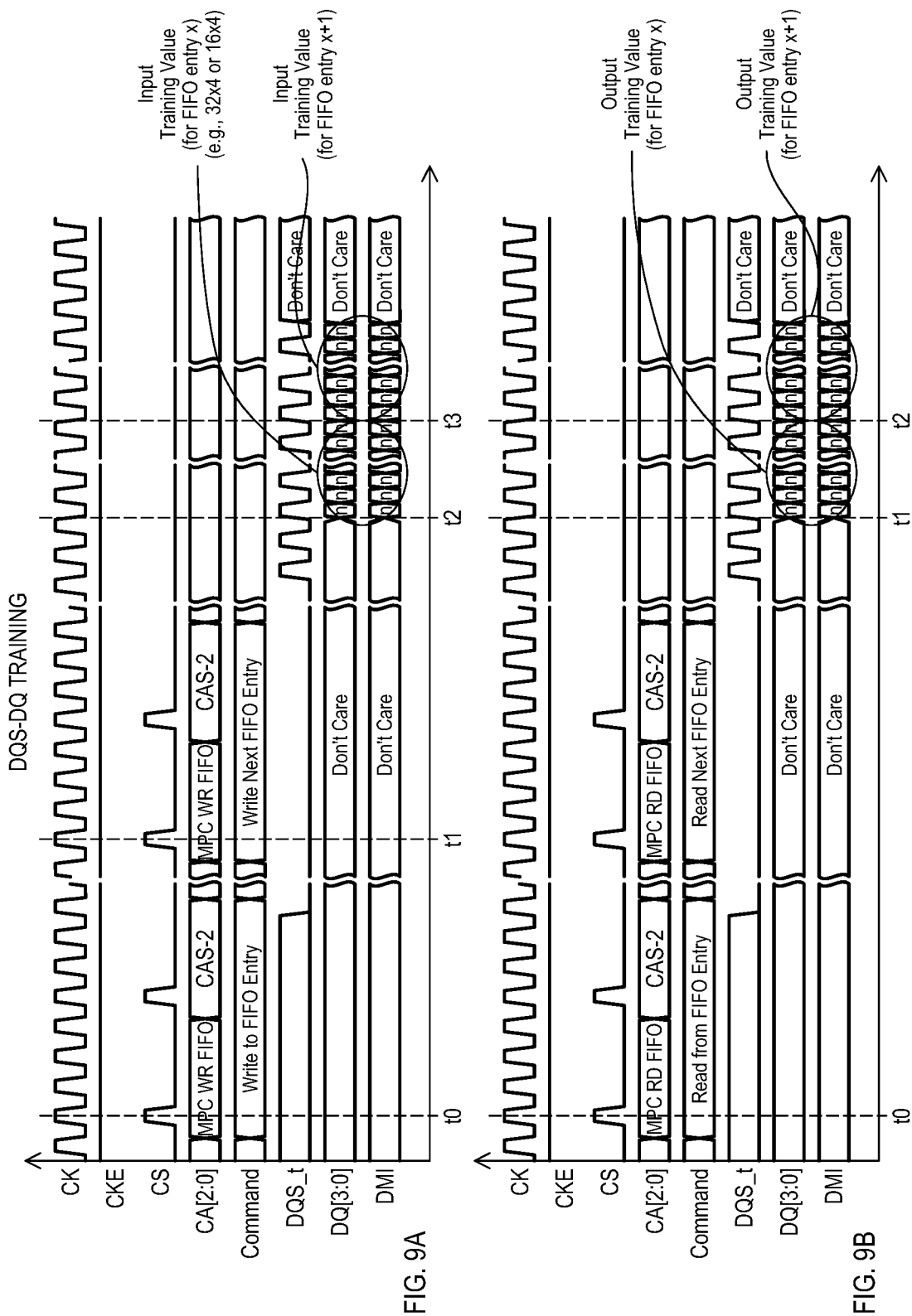

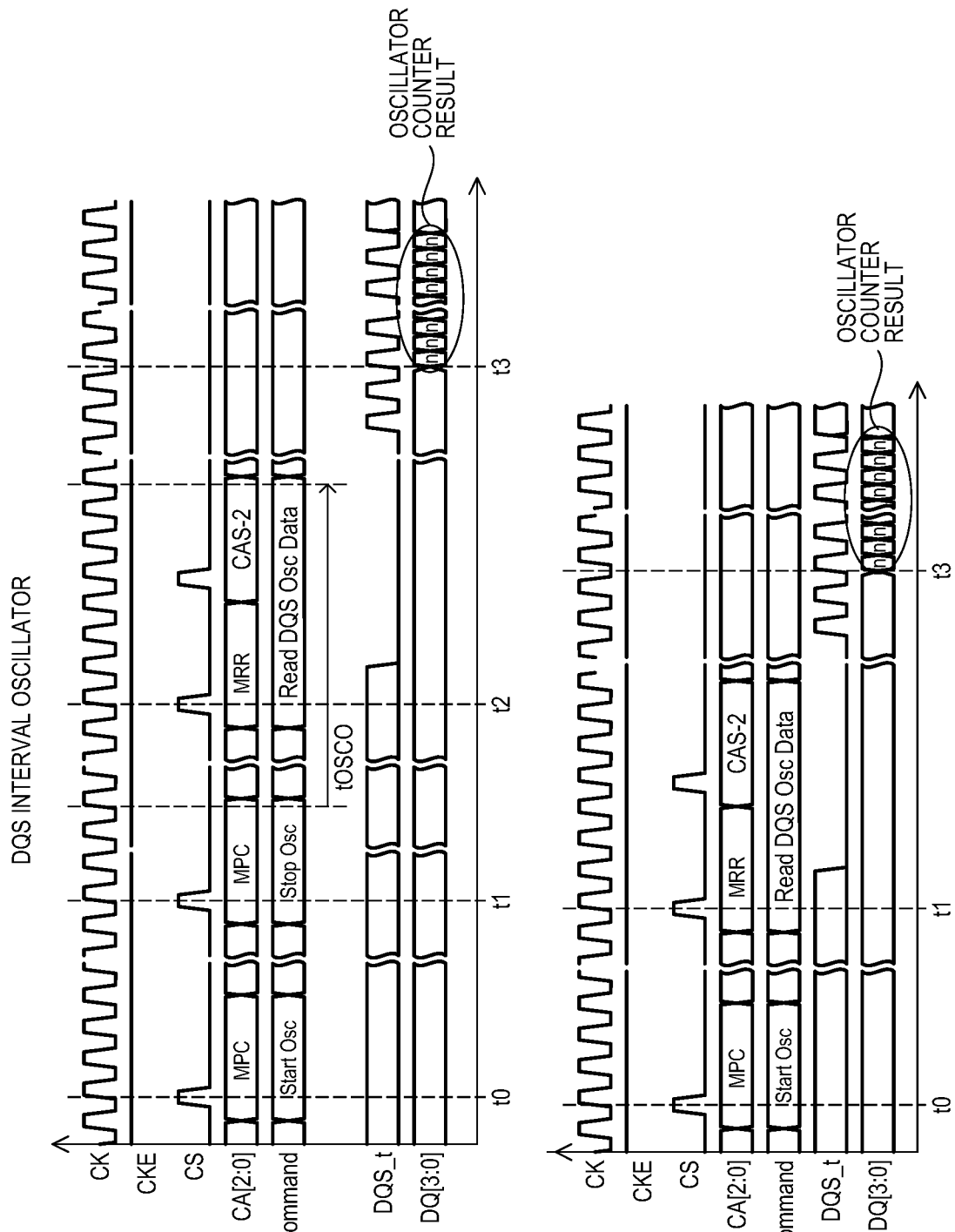

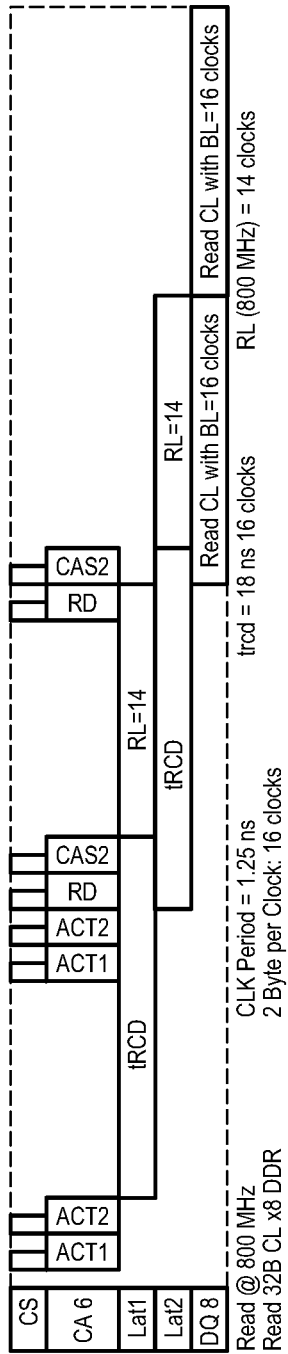
FIG. 30A (BACKGROUND)
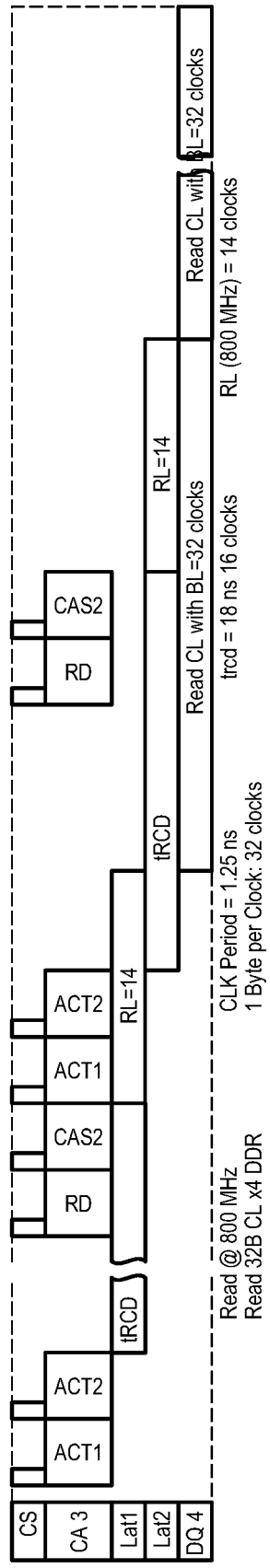
FIG. 30B
| Parameter | HB x16 | LPDDR x8 | LPDDR x4 |
|---|---|---|---|
| fCK | 200 MHz | 800 MHz | 800 MHz |
| Pin Count | 21 | 19 | 12 |
| Usable Bandwidth | 320 MB/s | 1600 MB/s | 800 MB/s |
| Signaling | LVCMOS | LVSTL | LVSTL |
FIG. 30C

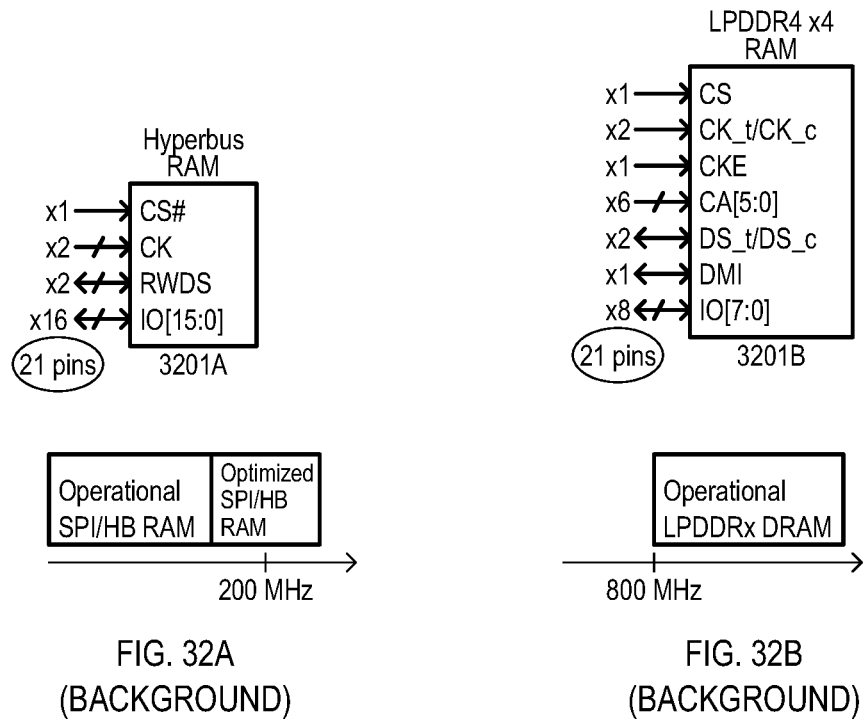
FIG. 32A
(BACKGROUND)
FIG. 32B
(BACKGROUND)
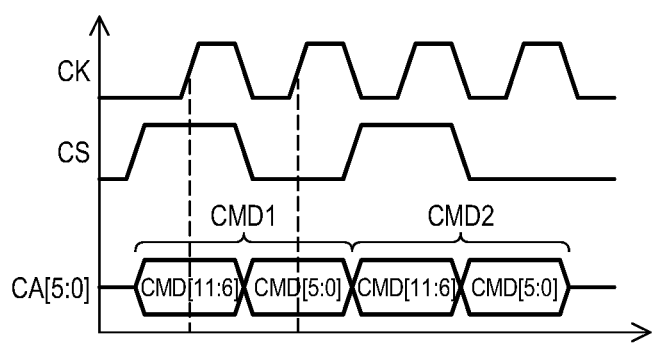
FIG. 32C
(BACKGROUND)

US 11,562,781 B1

MEMORY DEVICES WITH LOW PIN COUNT INTERFACES, AND CORRESPONDING METHODS AND SYSTEMS

TECHNICAL FIELD

The present disclosure relates generally to memory device interfaces, and more particularly to memory device interfaces having low pin counts along with high data transfer rates.

BACKGROUND

Memory devices remain critical components in most electronic systems. In terms of system performance, memory device data rates can be a limiting factor. In terms of system power consumption, any reduction in memory device power consumption is desirable. At the same time, for many systems, such as automobiles for example, it is desirable to keep system bus sizes to a minimum. Thus, low pin count memory devices enjoy wide use in such systems.

FIGS. 32A and 32B are diagrams showing conventional memory device types and performance. FIG. 32A shows an example of a memory device 3201A compatible with Hyper-Bus™ specification promulgated by Cypress Semiconductor Corporation, an Infineon Technologies Company. Memory device 3201A can provide a high performance solution. In some configurations, a memory device 3201A can operate at a clock speed of around 200 MHz, providing data on both rising and falling edges of the clock signal (i.e., double data rate, DDR). Device 3201A can include low voltage CMOS (LVCMOS) signaling. A memory device 3201A can be a nonvolatile memory device (e.g., NOR flash memory) or a volatile memory (e.g., hidden refresh DRAM).

FIG. 32B shows a memory device 3201B compatible with the low power DDR 4 (LPDDR4) standard JESD209-4D, promulgated by the Joint Electron Device Engineering Council (JEDEC). A memory device 3201B is a synchronous DRAM (SDRAM) that can provide high performance while employing a relatively high pin count. Memory device 3201B can have a differential clock input (CK_1/CK_c) and differential data strobes (DS_t/DS_c). While FIG. 32B shows a device with a x8 data input/output (IO), other LPDDR4 SDRAM can have larger IOs (i.e., x16). A memory device 3201B can operate at clock speeds starting at around 800 MHz, and utilize low voltage swing termination logic (LVSTL) signaling.

FIG. 32C is a timing diagram showing command processing operations of a conventional LPDDR4 device, such as that shown in FIG. 32B. In response to an active (high) chip select (CS) signal, a device can latch a first six-bit portion of a command on a rising edge of a clock signal (CK), and then latch a second six-bit portion of the command on the next rising edge of the clock signal (with CS being inactive).

While providing desirable high speed signaling, the large pin counts of conventional approaches can make them unsuitable for low pin count applications. In addition, the volatile storage of LPPDR4 SDRAM can make them unsuitable for many applications, such as the storage of firmware in a system.

BRIEF DESCRIPTION OF THE DRAWINGS

FIG. 4 is a table showing pin types and functions for a memory device according to an embodiment.

FIGS. 9A and 9B are timing diagrams showing data strobe-data bus training operations according to embodiments.

FIGS. 10A and 10B are timing diagrams showing data strobe interval oscillator operations according to embodiments.

FIGS. 30A to 30C are diagrams comparing the performance of a memory device according to an embodiment to that of conventional memory devices.

FIGS. 32A to 32C are diagrams showing conventional memory devices, performance, and operations.

DETAILED DESCRIPTION

According to embodiments, a memory device can provide high-speed signaling with a relatively low pin count. Command and address data can be received on a command-address (CA) bus of relatively small size, with commands being received in multiple portions, on three or more consecutive edges of a timing clock (e.g., rising edges). Data for the memory device can be received and transmitted at a double data rate (DDR) over a relatively small data bus, resulting in data bytes being received/transmitted over more than two consecutive rising and falling edges of the timing clock.

In some embodiments, a CA bus can be three bits, and receive 12-bit commands as four consecutive, 3-bit command portions.

In some embodiments, a data bus can be four bits, and transmit and receive DDR data in 4-bit nibbles.

In some embodiments, a memory device can include a data mask inversion (DMI) input/output (IO). As data are transferred on a data bus, the DMI IO can transmit both inversion data and/or error correction code (ECC) data in a same clock cycle. In some embodiments, as data are transferred in portions on the data bus, the DMI IO can indicate more significant bits and less significant bits of the data portions.

In some embodiments, in a calibration mode, a memory device can receive calibration setting data on both the CA bus and data bus at the same time. In some embodiments, calibration setting data can be a reference voltage setting used in a CA bus training operation and/or data bus training operation.

In some embodiments, a memory device can be a nonvolatile memory device that provides high-speed signaling with a low pin count.

Figure 1A:
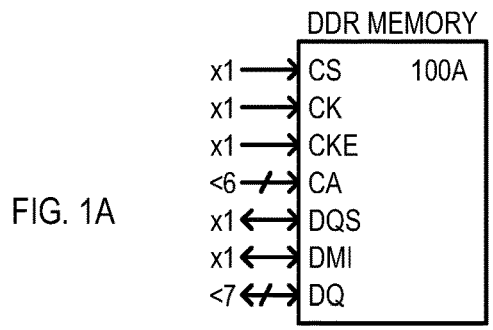
FIGS. 1A to 1D are diagrams showing memory device pinouts according to embodiments.

FIG. 1A is a block diagram of a memory device 100A according to an embodiment. A memory device 100A can provide a relatively low pin count, while at the same time provide relatively high speed signaling. Primary signaling pins for the memory device 100A can include a chip select (CS) input, a clock (CK) input, a clock enable (CKE) input, a command address (CA) input, a data strobe (DQS) IO, a data mask inversion (DMI) IO, and a data IO (DQ). A CA input can include no more than five inputs, while a DQ IO can include no more than six IOs. In some embodiments, the remaining inputs and IOs can be singular. Thus, a device 100A can have an overall pin count of no more than sixteen (excluding specialized pins). According to embodiments, a memory device 100A can store data in nonvolatile memory cells, volatile memory cells, or a combination thereof.

Figure 1B:
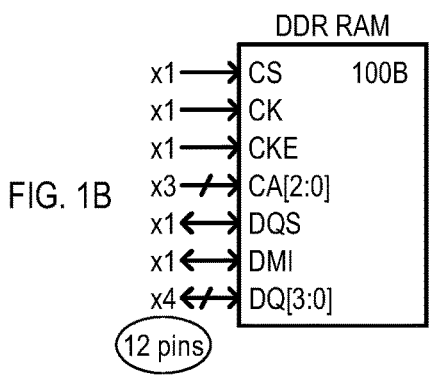

FIG. 1B is a block diagram of a memory device 100B according to another embodiment. A memory device 100B can be one implementation of that shown in FIG. 1A. Memory device 100B can include items like those of FIG. 1A, however, a CA input can be 3-bits, and a DQ IO can be 4-bits. In such an arrangement, a memory device 100B can have the relatively low pin count of 12 pins.

Figure 1C:
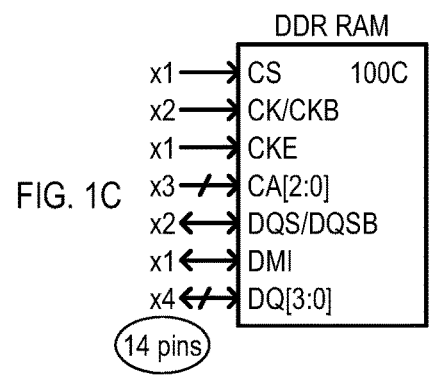

FIG. 1C is a block diagram of a memory device 100C according to another embodiment. A memory device 100C can be one implementation of that shown in FIG. 1A. Memory device 100C can include items like those of FIG. 1B, however, clock inputs can include complementary clock inputs (CK/CKB). Further, data strobe IOs can be complementary (DQS/DQSB). In such an arrangement, a memory device 100B can have the relatively low pin count of 14 pins.

Figure 1D:
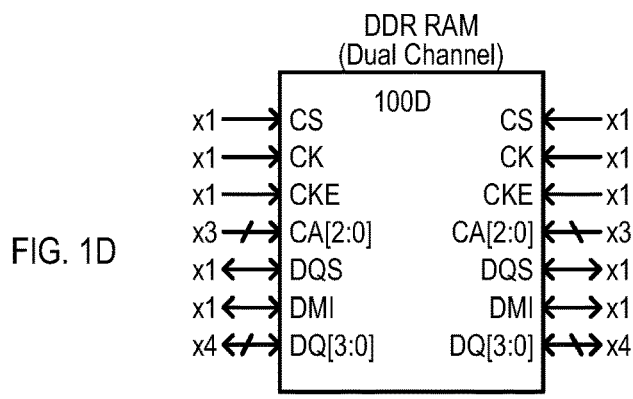

FIG. 1D is a block diagram of a memory device 100D according to another embodiment. A memory device 100C can be one implementation of that shown in FIG. 1A. Memory device 100C can include items like those of FIG. 1B, but can be a dual-channel device, providing two different interfaces. Other embodiments can include larger numbers of low pin count interfaces.

Figure 2:
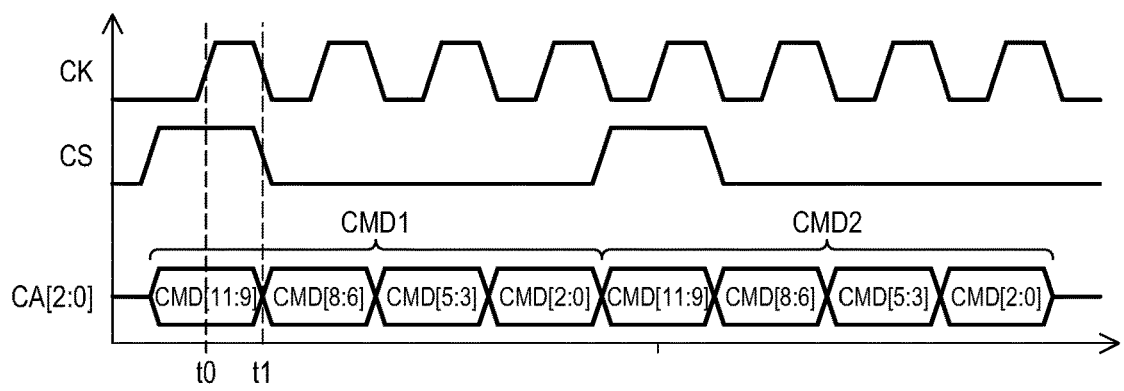
FIG. 2 is a timing diagram showing command input operations according to an embodiment.

FIG. 2 is timing diagram showing command input operations according to an embodiment. FIG. 2 shows waveforms for a clock input CK, a chip select input CS, and command address inputs CA[2:0].

At time t0, CK can transition high. At the same time, CS can be high, activating the device. On CA bus, a three bit portion (CMD[11:9]) of a 12-bit command (CMD1) can be received.

At time t1, CS can return low. On the following three high transitions of the clock signal, the remaining 3-bit portions of the command (CMD[8:6], CMD[5:3] CMD[2:0]) can be received. FIG. 2 shows a second command (CMD2) received immediately after the first command.

Figure 3A:
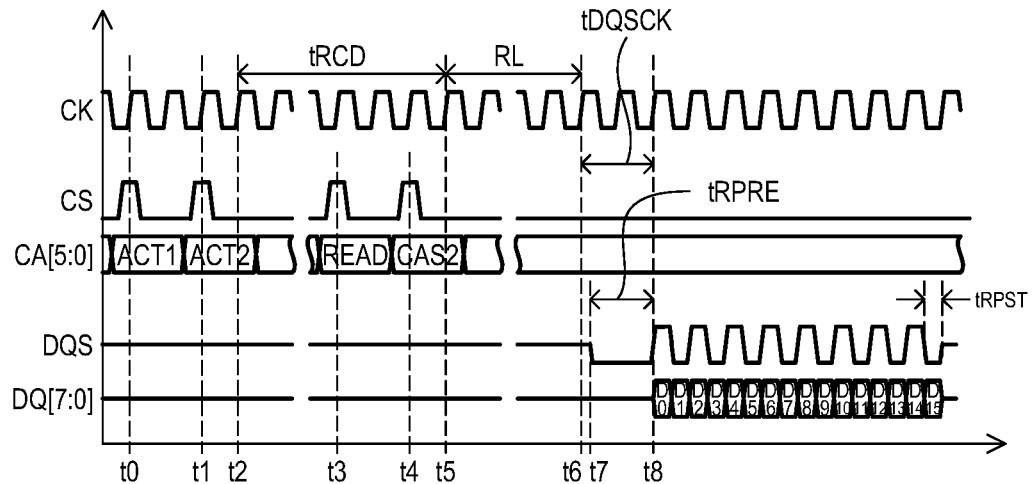
FIGS. 3A and 3B are timing diagram comparing read operations according to a conventional operation with an operation according to an embodiment.
Figure 3B:
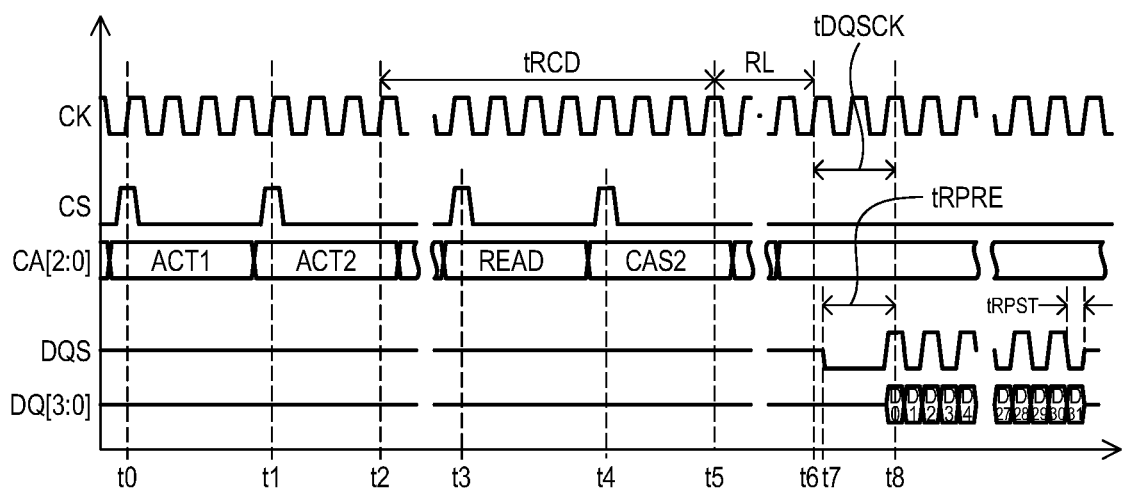

FIGS. 3A and 3B are timing diagrams comparing conventional read access operations compatible with an LPDDR4 standard to those according to an embodiment. FIG. 3A is a timing diagram showing CK and CS inputs, a six-bit CA[5:0] input, a DQS IO, and 8-bit DQ[7:0] IO.

At time t0, on a rising edge of CK, CS can be high, and a first six bits of a first activate command (ACT1) can be received. CS can then return low. On the following rising edge of the CK signal the last six-bits of ACT1 can be received. At time t1, a second activate command (ACT2) can be received.

At time t3, following the activation commands (ACT1/ACT2), a read command pair (READ/CAS2) can be input. The CAS2 command must be completed after a RAS-to-CAS delay (tRCD) following the last 6-bits of ACT2, shown from time t2 to t5.

At time t6, following a read latency (RL) after a last portion of the CAS2 command, a data strobe signal (DQS) can be active to enable the output of data. At time t7, DQS can go active for a preamble time tRPRE. At time t8, DQS can begin transitioning in synchronism with CK, and data can be output on DQ[7:0] at a double data rate, timed with DQS. 8-bits can be output every half clock cycle for eight clock cycles (shown as D0 to D15). Following the output of the read data, DQS can remain active for a postamble time period (tRPST).

FIG. 3B is a timing diagram showing a read operation corresponding to that of FIG. 3A, but with a device like that FIG. 1B. FIG. 3B has waveforms for the same signal sets, but with CA inputs being 3-bit, as opposed to six-bit, and DQ IOs being 4-bits instead of 8-bits.

In some embodiments, the read operation of FIG. 3B can execute the same commands as FIG. 3A, but with the commands being received over more clock cycles, and the read data being output over more clock cycles. In some embodiments, the read operation of FIG. 3B can operate with the same timing constraints as FIG. 3A, including tRCD, RL, tDQSCK, tRPRE, and tRPST.

Referring still to FIG. 3B, at time t0, the reception of an ACT1 command being with CS active on a rising edge of CK. However, only a 3-bit portion of the 12-bit command is received. With CS returned low, on the subsequent three rising edges of CK, different 3-bit portions of ACT1 can be received until all 12-bits are received.

At time t1, an ACT2 command can be received, being clocked in on four rising edges in the same fashion as ACT1.

READ and CAS2 commands can be received no sooner than a tRCD time period, as described for FIG. 3A, but each such command can also be received in four, 3-bit portions.

At time t8, read data can be output in a DDR fashion, but on a 4-bit data bus, over 16 clock cycles (shown as D0 to D31).

In this way, a memory device with a low pin count can execute commands compatible with existing standards. In some embodiments, memory devices can be compatible with an LPDDR4 standard, but with additional clock cycles for receiving command-address values and for the input of data values in write operations and the output of data values in read operations.

FIG. 4 is a table showing interface connection (i.e., pin) types and functions according to embodiments. CS, CK and CKE inputs can function in a conventional fashion, with some embodiments including a differential clock (CK_t, CK_c).

A CA[2:0] bus can be a reduced size bus to enable low pin count. Optionally, a CA[2:0] bus can receive calibration data in a calibration mode, such as a portion of a reference voltage value. A function of CA[2:0] bus can be established with mode register settings.

A DQS IO can function as a data alignment signal that is in synchronism with CK, and optionally can include differential signals (DQS_t, DQS_c).

A DMI IO can have any of multiple functions, including providing data masking values in write operations, indicating data inversion, providing ECC data and/or indicating upper and lower nibbles of the same byte for data output on bus DQ[3:0]. A function of a DMI signal can be established with mode register settings.

DQ[3:0] can be a reduced size data IO bus

FIG. 4 also includes support inputs that can be included in embodiments. RESET_n, and ODT(ca) can have conventional functions.

Figure 5A:
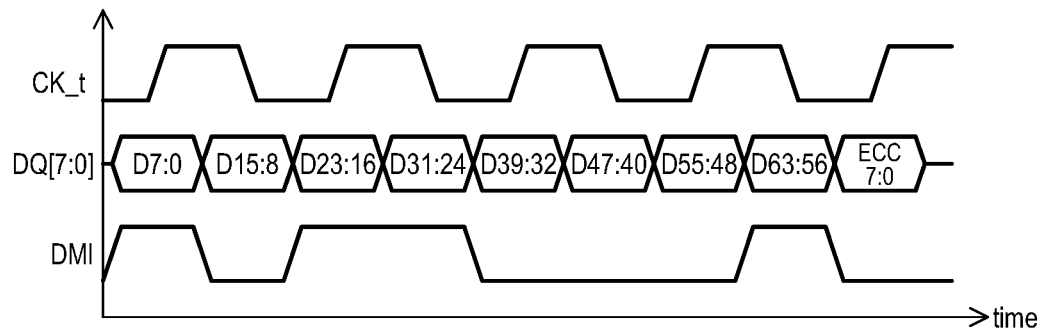
FIG. 5A to 5C are timing diagrams comparing conventional error correction code (ECC) data transmission to that of an embodiment.
Figure 5B:
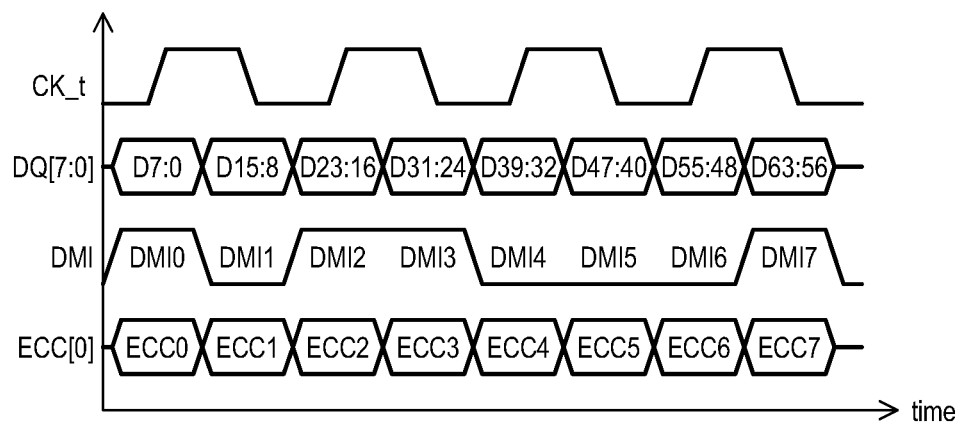
Figure 5C:
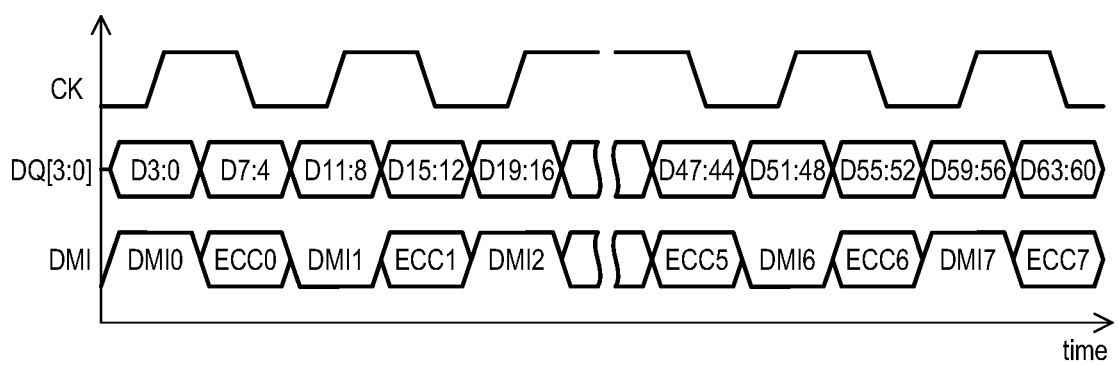

FIGS. 5A to 5C are timing diagrams comparing conventional ECC data transmission to those according to an embodiment.

FIG. 5A shows a conventional arrangement for providing "in band" ECC data. 64-bits of data are transmitted on DQ[7:0] in a burst of eight. The data transmission is DDR, with 8-bits of data being transmitted in synchronism with rising and falling edges of a clock (CK_t). For each 8-bit data value, a DMI IO can indicate data inversion (e.g., DMI high) or no data inversion. After the data burst, eight bits of ECC data (ECC7:0), corresponding to the 64-bits of data are provided on DQ[7:0]. That is, extra bus time is required to receive ECC data.

FIG. 5B shows a conventional arrangement for providing "out of band" ECC data. 64-bits of data are transmitted on DQ[7:0] with a DMI value as in the case of FIG. 5A. However, an ECC IO is also included, which enables a bit of ECC data to be transmitted with each data byte on DQ[7:0]. Such an arrangement requires a further increase in pin count.

FIG. 5C shows the transmission of "in band" ECC data according to an embodiment. FIG. 5C shows waveforms for a timing clock CK, a reduced size data bus DQ[3:0], and a multifunction IO (DMI). 64-bits of data are transmitted on DQ[3:0] in a burst of sixteen. The data transmission is DDR, with 4-bits of data (i.e., nibbles) being transmitted in synchronism with rising and falling edges of a clock (CK). Within a clock cycle, a DMI signal can provide both a data mask inversion value (for two nibbles) as well as an ECC value. For example, data mask inversion value DMI0 can indicate data inversion for nibbles D3:0 and D7:4. Such an arrangement can allow ECC data to be transmitted in band without the need for extra data bus time.

In some embodiments, a DMI signal indicate data masking for a write operations. When a DMI signal has one value (e.g., high) data values can be masked from being written into a device. When a DMI signal has another value (e.g., low), the data can be written into the device. Referring to FIG. 5C in a data masking operation there would be no ECC values. A high DMI value for nibble D3:0 would result in such values not being written. If the DMI signal was low in the subsequent half cycle (shown as ECC0), nibble D7:4 would be written.

Figure 6A:
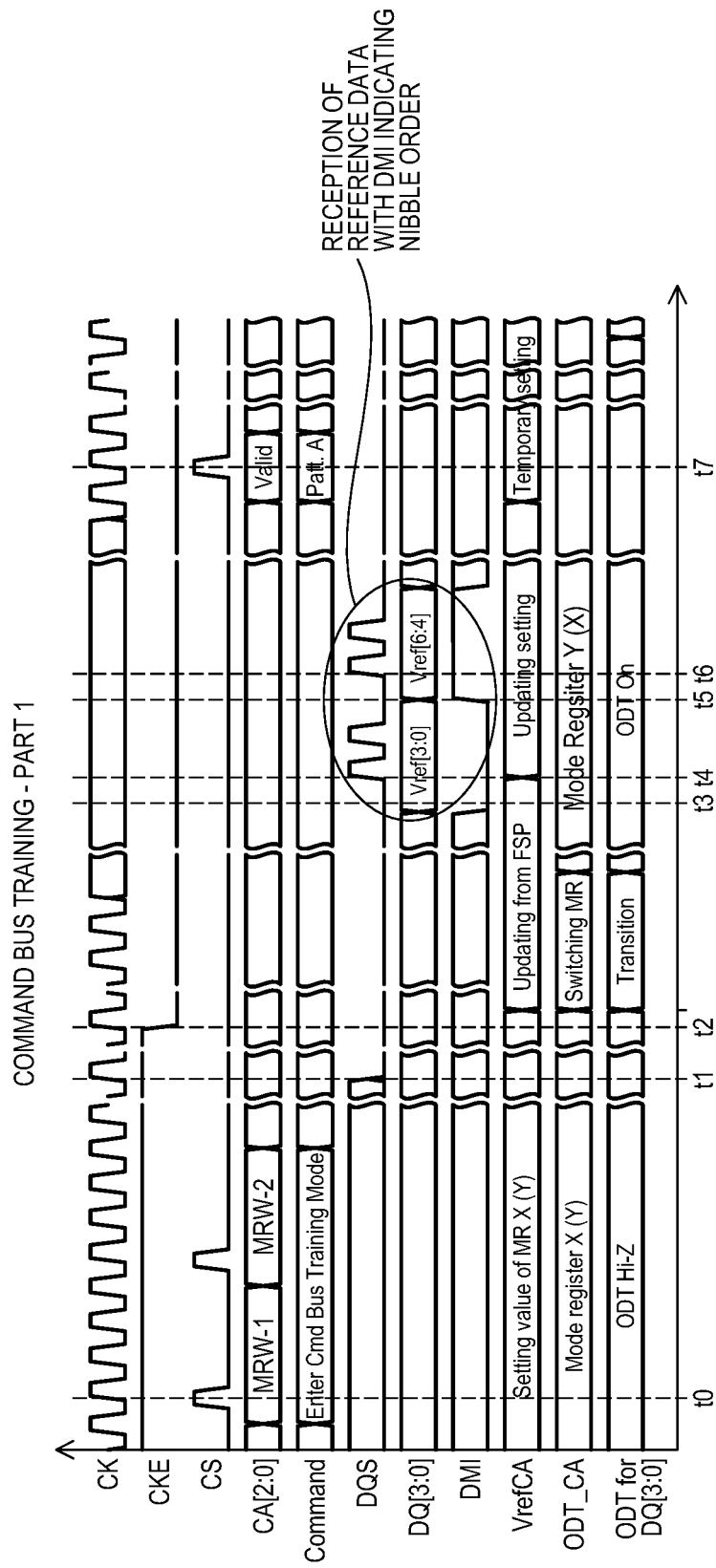
FIGS. 6A to 6C are timing diagrams showing command bus training operations of a memory device according to embodiments.
Figure 6B:
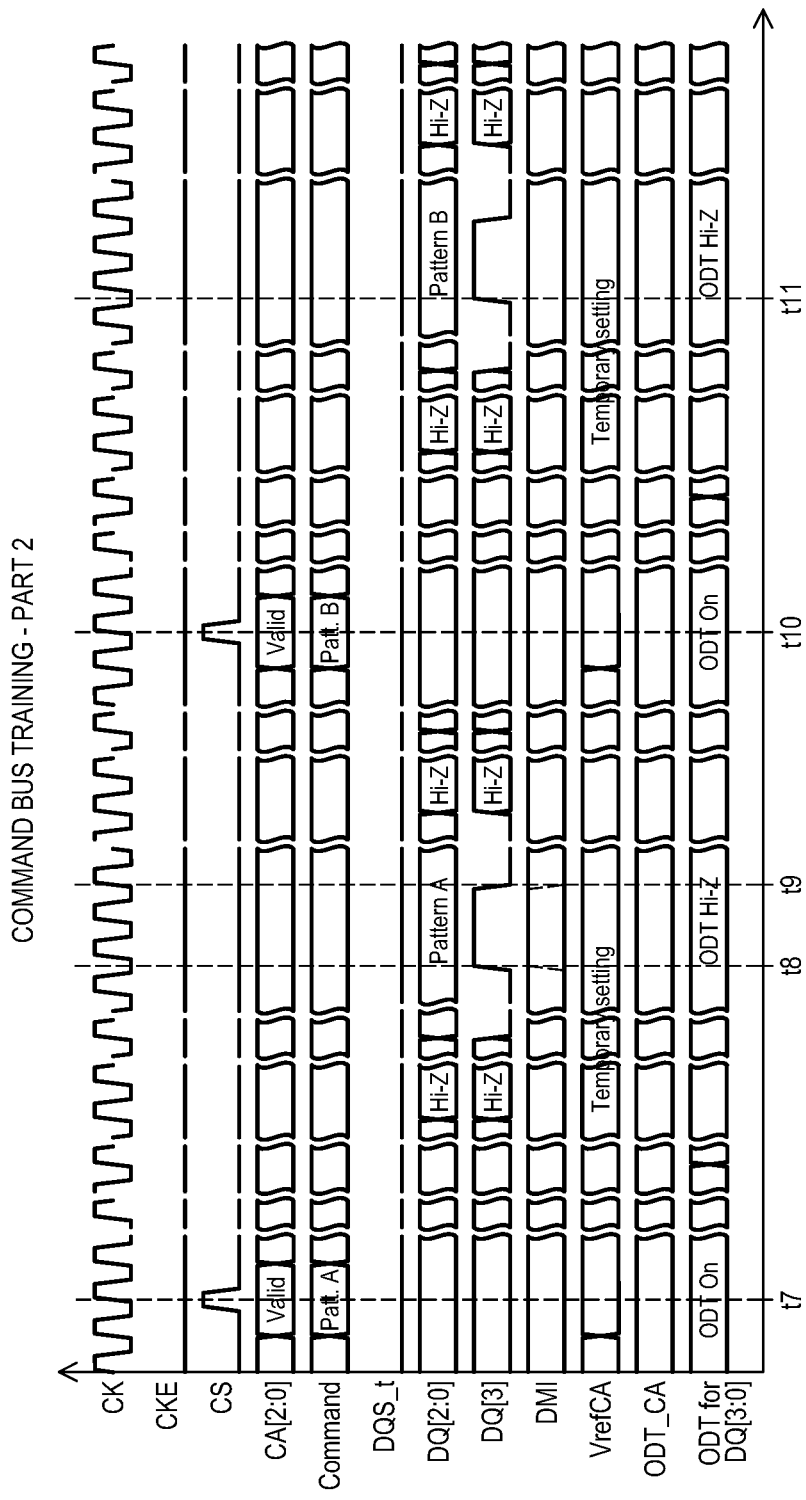

FIGS. 6A and 6B are a timing diagrams of a command bus training operation for a memory device according to an embodiment. FIG. 6A includes waveforms for CK, CKE, CS, CA[2:0], DQS, DQ[3:0] and DMI, which can be as described herein, or equivalents. FIG. 6A also includes the following other waveforms: Command, which describes values entered on CA[2:0]; VrefCA, a status for a calibration reference voltage; and ODT for DQ, an on-die termination status for the DQ bus. FIG. 6B includes the same waveforms as FIG. 6A, but shows DQ[2:0] and DQ[3] separately.

Referring to FIG. 6A, at time t0, a memory device can receive two 12-bit commands (e.g., mode register write commands, MRW-1/MRW-2) that can place the memory device into a command bus training mode. Such commands can each be received in four, 3-bit portions on consecutive rising edges of CK, as described herein.

At time t1, a predetermined time period before CKE transitions low, DQS can transition low. At time t2, CKE can transition low. Subsequently, there can be updating of frequency set point values (FSP) (shown in VrefCA), a switch between mode registers can begin (shown in ODT_CA), and a transition in ODT settings for data IOs (shown in ODT for DQ[3:0]).

At time t3, according to predetermined timing, a portion of a reference value Vref[3:0] can be driven on DQ[3:0]. DMI can be low, to indicate that the reference value portion includes the lower (i.e., less significant) bits of the Vref value.

At time t4, DQS_t can strobe high to indicate the presence of the Vref[3:0] value on DQ[3:0]. In some embodiments, DQS_t can strobe high more than once to ensure the reference value is captured.

At time t5, a second portion of the reference value Vref[6:4] can be driven on DQ[3:0]. DMI can be driven high, to indicate that the reference value portion includes the higher (i.e., more significant) bits of Vref. At time t6, DQS_t can be driven high one or more times to indicate the presence of the second reference value portion. In the embodiment shown, a reference value is seven bits, however alternate embodiments can include greater or fewer numbers of bits, including four bit values which would not include a DMI transition.

At time t7, a calibration pattern (Pattern A) can be driven on CA[2:0]. Referring to FIG. 6B, at time t8, following the application of a calibration pattern on CA[2:0], the pattern (Pattern A) as received by the memory device can be provided on DQ[2:0]. In the embodiment shown, DQ[3] can be driven to predetermined level (in this case high) to signal the presence of the capture pattern value. In an alternate embodiment, DMI can be used to signal the presence of captured pattern data. At time t9, DQ[3] can return to a previous level (in this case low).

In the embodiment shown, at time t10, a second calibration pattern (Pattern B) can be applied to CA[3:0], and the calibration operation can continue.

Figure 6C:
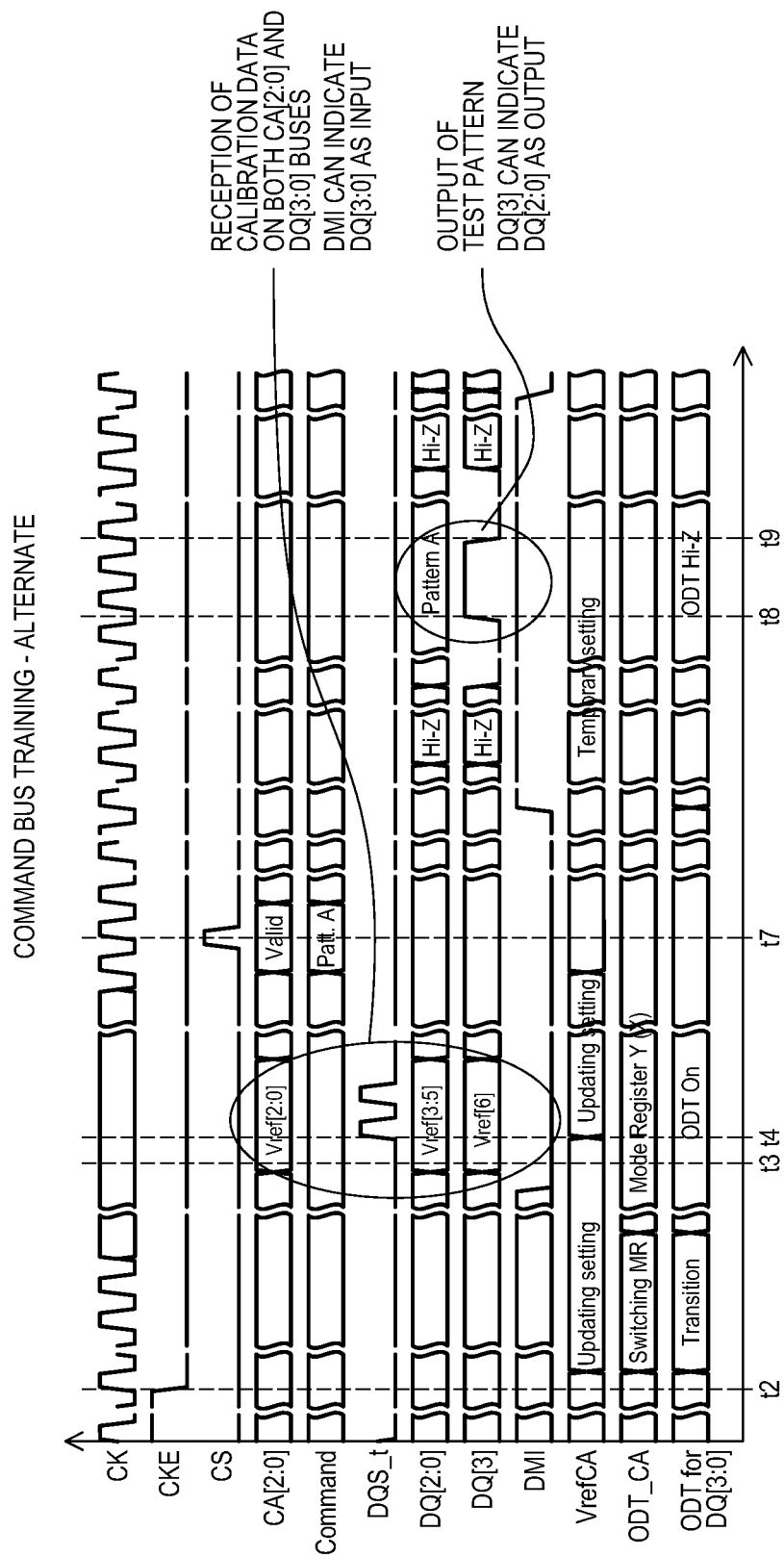

FIG. 6C is a timing diagram of a command bus training operation according to another embodiment. A training operation can be proceeded by training mode commands as shown between times t0 and t1 of FIG. 6A.

Unlike FIG. 6A, at time t3, calibration data can be presented on both the CA[2:0] bus and the DQ[3:0] bus. At time t4, DQS_t can be activated one or more times to indicate the presence of the calibration data. In some embodiments, a DMI IO can be driven low, which can indicate DQ[3:0] are to operate as inputs. A calibration operation can then proceed as shown in FIG. 6B, with calibration patterns being applied at CA[2:0] and such patterns as detected by the memory device can be subsequently output on DQ[3:0] at time t8. In some embodiments, a DMI IO can be driven high, which can indicate DQ[3:0] are to operate as outputs, providing the pattern data.

Figure 7:
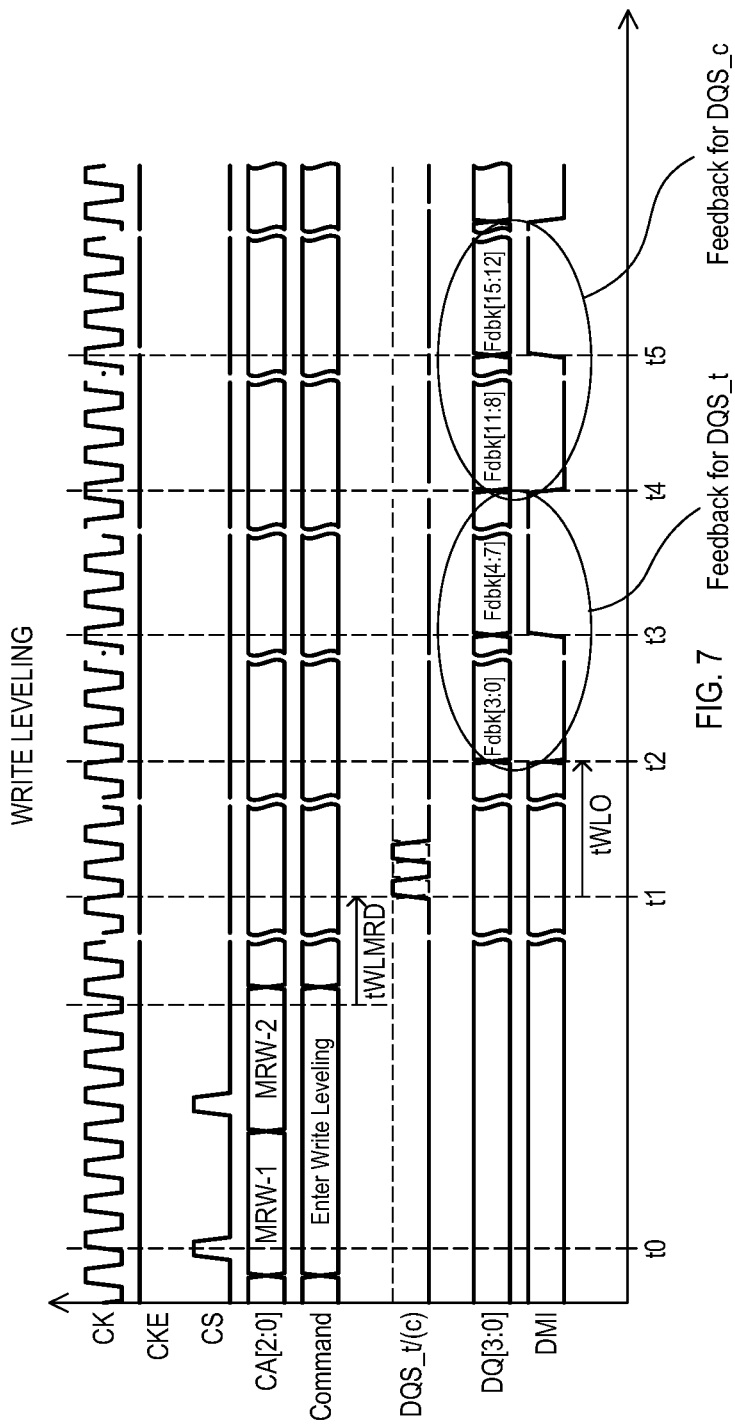
FIG. 7 is a timing diagram showing a write leveling operation of a memory device according to an embodiment.

FIG. 7 is a timing diagram of a write leveling operation for a memory device according to an embodiment. FIG. 7 includes waveforms for CK, CKE, CS, CA[2:0], Command, DQ[3:0] and DMI, previously described herein. FIG. 7 also includes differential data strobe signals DQS_t/(c). however alternate embodiments can include a single ended DQS signal.

At time t0, a memory device can receive two 12-bit mode register write commands (MRW-1, MRW-2) that can place the memory device into a write leveling mode. Such commands can each be received in four, 3-bit portions on consecutive rising edges of CK, as described herein.

At time t1, following a time period tWLMRD after a last portion of MWR-2, data strobe signals (DQS_t or DQS_c) can transition. Time period tWLMRD can be established by a controller device. At this time, a memory device can sample the strobe signal to generate a feedback value. In some embodiments, clock CK can be used to sample a data strobe signal (DQS_t or DQS_c). If the sampled DQS signal has one value (e.g., high) all of the data bus DQ[3:0] can have that value (e.g., high). If the sampled DQS signal has another value (e.g., low) all of the data bus DQ[3:0] can have that value (e.g., low).

At time t2, following a write leveling output delay (tWLO), feedback values (e.g., sampled clock states) can be output by the memory device. A first portion of a feedback value can be output (Fdbk[3:0]). At time t3, a second portion of a feedback value can be output (Fdbk[7:4]). A value of DMI can change, indicating a change in nibble value (in this case higher significance bits). At time t4, a third portion of a feedback value can be output (Fdbk[11:8]), followed by a fourth portion (Fdbk[15:12]).

From such feedback values, a controller can adjust the placement of DQS_t/DQS_c signals with respect to clock CK.

Figures 8A, 8B:
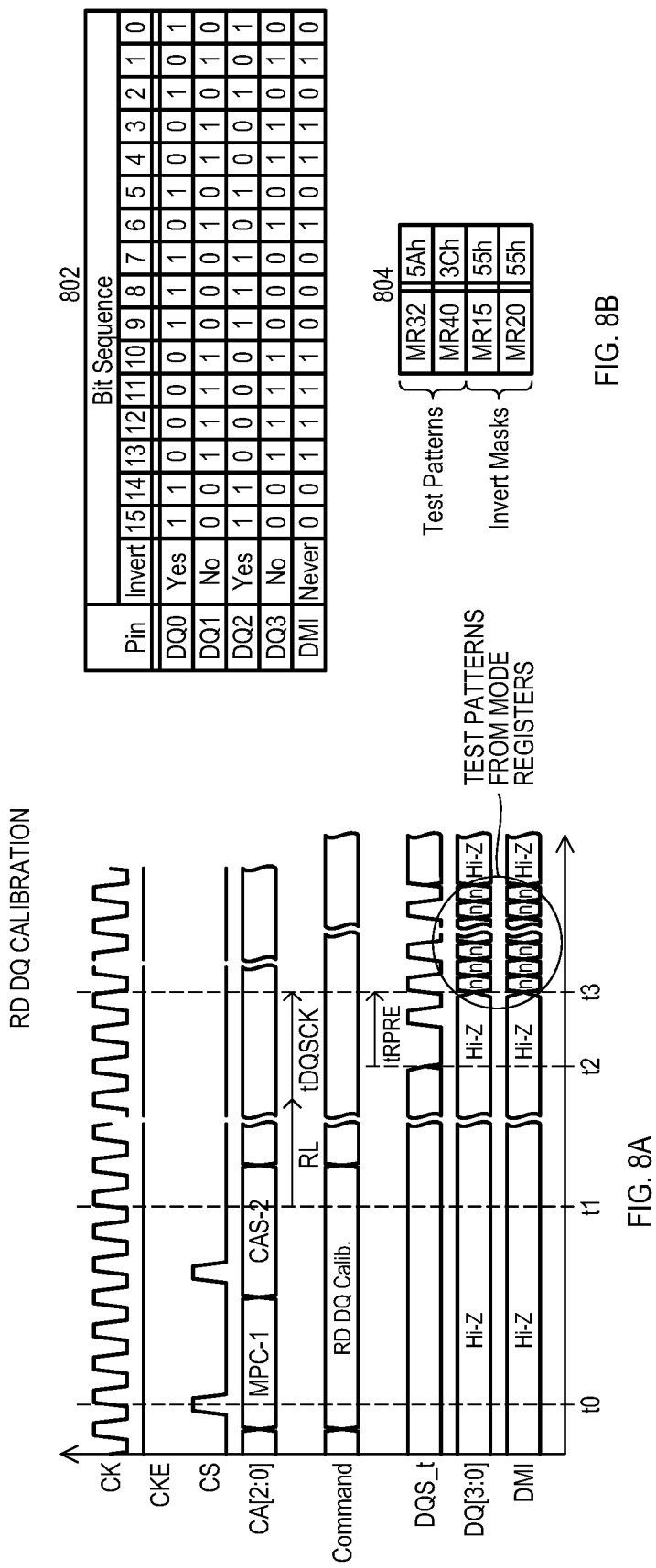
FIGS. 8A and 8B are diagrams showing read data bus calibration operations according to an embodiment.

FIGS. 8A and 8B are diagrams showing a read data bus (RD DQ) calibration operation for a memory device according to an embodiment. FIG. 8A is a timing diagram that includes waveforms previously described herein. FIG. 8B includes a table showing a bit sequence output on DQ IOs and a DMI IO in a RD DQ calibration operation.

Referring to FIG. 8A, at time t0, a memory device can receive two 12-bit commands, including a multi-purpose command (MPC-1) followed by a CAS-2 command. Such commands can place the memory device into a RD DQ calibration mode. Such commands can each be received in four, 3-bit portions on consecutive rising edges of CK, as described herein. In the RD DQ calibration mode, a memory device can access mode registers, and output a pattern defined in such registers on DQ outputs.

Following a read latency (RL) and output access time (tDQSCK), a test pattern can be output on a reduced size bus DQ[3:0] at time t3.

Referring to FIG. 8B, a table 802 shows bit sequences that can be output on DQ IOs according to values stored in mode registers 804. Mode registers 804 can store values corresponding to test patterns as well as inversion masks for such test patterns. In the RD DQ calibration operation shown, DMI values are not inverted and do not dictate inversion of DQ output values. Register values 804 can be programmable, and can also be set to default values.

FIGS. 9A and 9B are timing diagrams showing a data strobe to data bus (DQS-DQ) training operation for a memory device according to an embodiment. A DQS-DQ training operation can generate test patterns to enable a data strobe signal DQS to be properly aligned with DQ values (e.g., DQS enables a DQ data latch in the center of the data "eye"). FIG. 9A shows test FIFO write operations. FIG. 9B shows test FIFO read operations.

Referring to FIG. 9A, at time t0, a memory device can receive two 12-bit commands, including a multi-purpose command (MPC WR FIFO) followed by a CAS-2 command. Such commands can place the memory device into a write to test FIFO mode. Such commands can each be received in four, 3-bit portions on consecutive rising edges of CK, as described herein. In the embodiment shown, the write FIFO command is repeated at time t1.

At time t2, following a write latency and other timing constraints, write data values can be driven on DQ[3:0] (and optionally DMI). Data values can be selected by a controller device or the like. Further, data values DQ[3:0] can be provided with a data strobe value DQS_t having an initial timing. Such write data values can be stored in an entry (entry x) of a test FIFO. Test data can take any suitable form according to the type of training for the controller. In the embodiment shown, due to the timing of the two write to test FIFO commands, data for a next entry (entry x+1) can follow that of the previous entry at time t3. In some embodiments, each write FIFO operation can write data into a next FIFO entry until a last FIFO entry is reached.

Referring to FIG. 9B, after test data have been written into a test FIFO with an initial DQS_t timing, such data values can be read out from the test FIFO to evaluate the DQS_t timing.

Referring to FIG. 9B, at time t0, a memory device can receive two FIFO read commands, each formed with an MPC RD FIFO command followed by a CAS-2 command.

At time t1, following a read latency and other delays, data values from a first FIFO entry (entry x) can be output on DQ{3:0] (and optionally DMI). From such data values, a controller can determine the performance of a current DQS_t timing and adjust such timing, if necessary. In the embodiment shown, due to the timing of the two read from test FIFO commands, data for a next entry (entry x+1) can follow that of the previous entry at time t2. In some embodiments, each read FIFO operation can read data from a next FIFO entry until a last FIFO entry is reached.

FIGS. 10A and 10B are timing diagrams showing a DQS interval oscillator read operation for a memory device according to an embodiment. In such an operation, an oscillator that includes the DQS clock tree path can be started and stopped to generate a count value. The count value can be used to detect any variation in the DQS clock tree path. If any such variation is sufficiently large, a memory device can be subject to retraining.

Referring to FIG. 10A, at time t0, a memory device can receive a 12 bit multi-purpose command that starts the DQS interval oscillator. The command can be received as four, 3-bit portions on consecutive rising edges of the CK signal as described herein.

At time t1, after a measurement time period, which can be selected by a controller or the like, a memory device can receive a 12 bit multi-purpose command that captures the count value. The command can be received in the same manner as the start oscillator command (MPC command). Upon receiving a stop oscillator command, the count value can be stored in a register.

At time t2, a read register command can be issued to read the counter value from the appropriate register. In the embodiment shown, this can include two 12-bit commands, including a mode register read (MRR) command followed by a CAS-2 command. In some embodiments, such commands can be received no sooner than a predetermined delay (tOSCO).

At time t3, following a read latency and other delays, an oscillator counter value from the register can be output on DQ[3:0]. From such data values, a controller can determine if additional training is needed to account for changes in the delay introduced by a DQS_t clock tree path.

FIG. 10B is a timing diagram of an alternate method for acquiring a DQS interval oscillator count value. Operations in FIG. 10B can be like those of FIG. 10A, but a read register command (issued at t1) can result in both storing the count value in a register and then outputting the count value (at time t3) on DQ[3:0].

Figure 11:
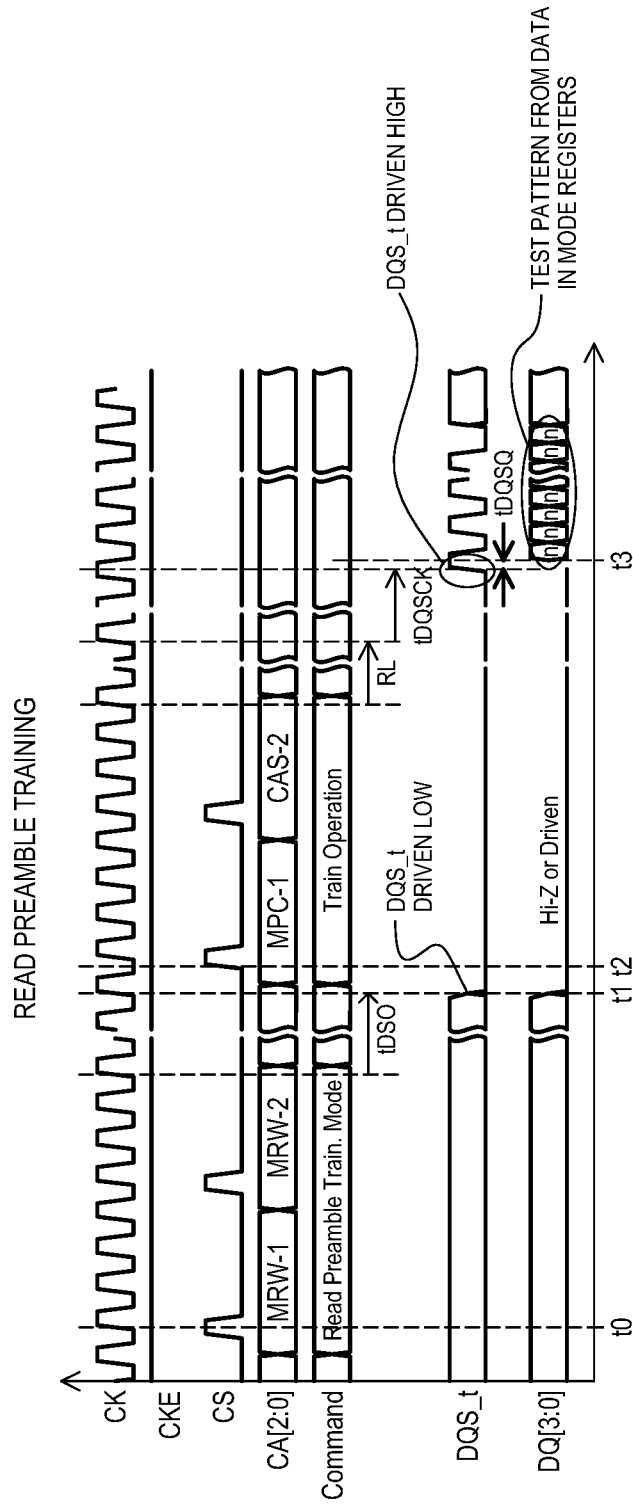
FIG. 11 is a timing diagram showing a read preamble training operation according to an embodiment.

FIG. 11 is a timing diagram of a read preamble training operation for a memory device according to an embodiment. FIG. 11 includes waveforms as described herein. Read preamble training operations can be used to establish a read preamble timing for the DQS_t signal. While FIG. 11 shows only DQS_t, other embodiments can include differential data strobe signals DQS_t/DQS_c, in which a DQS_c signal will be driven to opposite levels to of the DQS_t.

At time t0, a memory device can receive 12-bit commands MRW-1 and MRW-2 that can place the memory device into a read preamble training mode. Such commands can each be received in four, 3-bit portions on consecutive rising edges of CK, as described herein. After a delay tDSO following the last 3-bit portion of MRW-2, DQS_t can be driven low at time t1. Following such a transition, the memory device will not lead output data with a standard preamble or follow output data with a standard postamble.

At time t2, a memory device can receive 12-bit commands MPC-1 and CAS-2 over eight rising transitions of CK to initiate a training operation. At time t3, in response to such commands, following a read latency and other delay (e.g., tDQSCK), a DQS_t signal can transition in synchronism with data output on DQ[3:0]. In some embodiments, such output data can be data stored in registers (e.g., those shown in FIG. 8B). From such data, a controller can evaluate or train its DQS receivers.

Figure 12A:
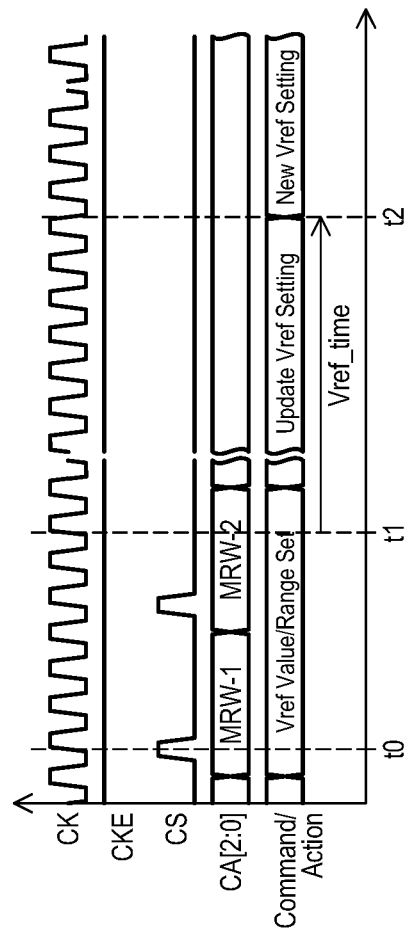
FIGS. 12A and 12B are timing diagrams showing reference voltage training operations according to embodiments.
Figure 12B:
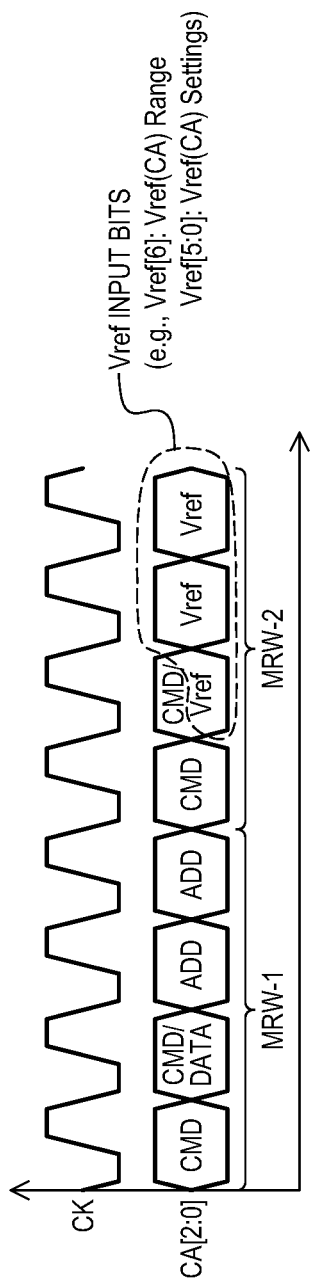

FIGS. 12A and 12B are timing diagrams showing CA Vref training operations according to embodiments. CA Vref training operations can be used to establish a reference voltage for CA inputs. However, the same process can be used to establish any other suitable reference value in a memory device. FIG. 12A is a timing diagram showing waveforms as described herein. FIG. 12B are timing diagrams detailing data included in commands received.

Referring to FIG. 12A, at time t0, a memory device can receive 12-bit commands MRW-1 and MRW-2 that can place the memory device into a reference value setting operation. Each such commands can each be received in four, 3-bit portions on consecutive rising edges of CK, as described herein.

Following receipt of a last portion of MRW-2, after a delay Vref_time, a new reference value can be established. In some embodiments, a delay Vref_time can vary according to a magnitude of the change.

Referring to FIG. 12B, the structure of commands in a reference setting operation according to an embodiment are shown in a timing diagram. Types of data included in the commands can include command data, CMD (i.e., bits identifying the command); address values, ADD (i.e., bits identifying a register address); reference values, Vref (i.e., bits that can set a reference value); and DATA (which may include other data).

In the embodiment of FIG. 12B, a first command (MRW-1) can include command data in the first two portions, and address data in the second two portions. A second command (MRW-2) can include command data in the first two portions, and reference values in the second two portions. In one embodiment, in which reference values establish a CA reference voltage, such reference values can include one bit for the range of the Vref(CA) value, and six bits for setting the Vref(CA) value.

It is understood that the particular values shown in FIG. 12B are but one example and should not be construed as limiting.

Command and address data values for the various operations shown in FIGS. 6A to 12B can take any suitable form. However, in some embodiments, command and address values can be compatible with the LPDDR4 standard (JESD209-4D), but be transmitted on the novel CA bus and manner as described herein, and equivalents.

Figure 13:
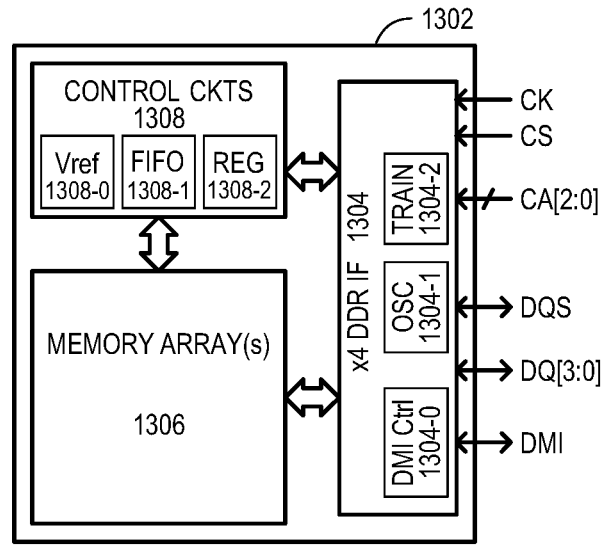
FIG. 13 is a block diagram of a memory device according to an embodiment.

FIG. 13 is a block diagram of a memory device 1302 according to an embodiment. A memory device 1302 can include a x4 DDR interface (I/F) circuit 1304, one or more memory arrays 1306 and control circuits 1308. x4 DDR I/F circuit 1304 can include CK, CS, CA[2:0] inputs, and DQS, DQ[3:0] and DMI IOs as described herein, or equivalents. While CK and DQS inputs are shown as single ended, in alternate embodiments, either or both such inputs can be differential inputs. As described herein, x4 DDR if 1304 can be a parallel interface as data are transmitted in parallel as nibbles on DQ[3:0]. A x4 DDR I/F circuits 1304 can include DMI control circuits 1304-0, which can provide functions for the DMI IO beyond indicating data masking during write operations or data inversion during read or write operations. Such additional functions can include, but are not limited to, providing ECC data for read and write operations, indicating an upper or lower nibble indicator for read or write data on DQ[3:0], and/or a status of DQ[3:0] (e.g., receiving or transmitting data).

In some embodiments, x4 DDR IF 1304 can include an oscillator circuit 1304-1. Oscillator circuit 1304-1 can include at least a portion of the DQS signal path, and can be used to determine a delay value for a DQS signal path. In some embodiments, a x4 DDR I/F circuit 1304 can include training circuits 1304-2. Training circuits 1304-2 can enable data received on CA[2:0] to be provided to circuits other than command and/or address decoding circuits. In some embodiments, training circuits 1304-2 can enable one portion of a reference value, such as those that establish a reference voltage, to be input along with another portion of the reference value on DQ[3:0] IOs.

Memory array(s) 1306 can include one or more memory cell arrays that can store data in write operations, and output data in response to read operations. Memory cell arrays can include memory cells of any suitable type (e.g., volatile, nonvolatile) or architecture (random access, NOR, NAND). Memory array(s) 1306 can also include corresponding decoding circuits, read path circuits, and write path circuits, including program and erase circuits in the case of nonvolatile memory cells.

Control circuits 1308 can control operations of the memory device, and can include logic for executing operations indicated by commands received via x4 DDR I/F 1304. Control circuits 1308 can include registers 1308-2 for storing configuration and other values (e.g., mode register). All or a portion of such registers 1308-2 can be accessed with mode register read and mode register write commands.

In some embodiments, control circuits 1308 can include a FIFO 1308-1 and/or reference voltage generator 1308-0. A FIFO 1308-1 can store values received at x4 DDR IF 1304 during for subsequent read out during calibration operations. A reference voltage generator 1308-0 can generate reference voltage in response to configuration reference values received at x4 DDR IF 1304.

Figure 14:
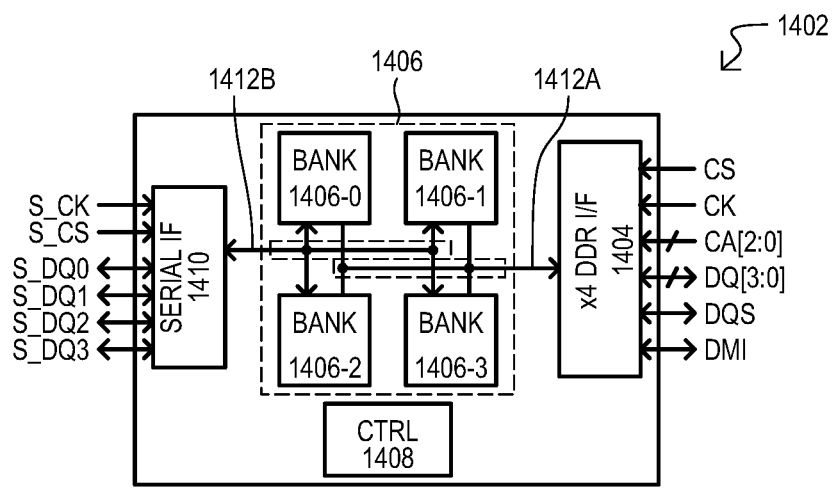
FIG. 14 is a block diagram of a memory device according to another embodiment.

FIG. 14 is a block diagram of a memory device 1402 according to another embodiments. A memory device 1402 can include items like those of FIG. 13, and such items are referred to by the same reference character, but with the leading digits being "14" instead of "13". A memory device 1402 can differ from that of FIG. 13 in that memory array(s) are arranged into banks 1406-0 to -3, and the memory device 1402 can further include a serial IF 1410. A serial IF 1410 can enable serial data transactions on one or more serial data IOs (four shown as S_DQ0 to S_DQ3) in synchronism with a serial clock S_CK and serial chip select S_CS. In some embodiments, a serial IF 1410 can be compatible with a Serial Peripheral Interface (SPI) standard. However, alternate embodiments can include an interface compatible with any other suitable serial standard.

Banks (1406-0 to -3) can each include a number of nonvolatile memory (NVM) cells. Within each bank (1406-0 to -3) NVM cells can be arranged into one or more arrays. NVM cells can take any suitable form, and in some embodiments can be "flash" type NVM cells. Banks (1406-0 to -3) can be separately addressable. That is, a physical addressing of device 1402 can have a separate bank address for each bank (1406-0 to -3). In the embodiment shown, all banks (1406-0 to -3) can be connected to a first bus system 1412A or a second bus system 1412B. First bus system 1412A can connect banks (1406-0 to -3) to x4 DDR IF 1404 and second bus system 1412B can connect banks (1402-0 to -3) to second I/F 1406. While FIG. 14 shows a device with four banks, embodiments can include greater or fewer numbers of banks.

Figure 15:
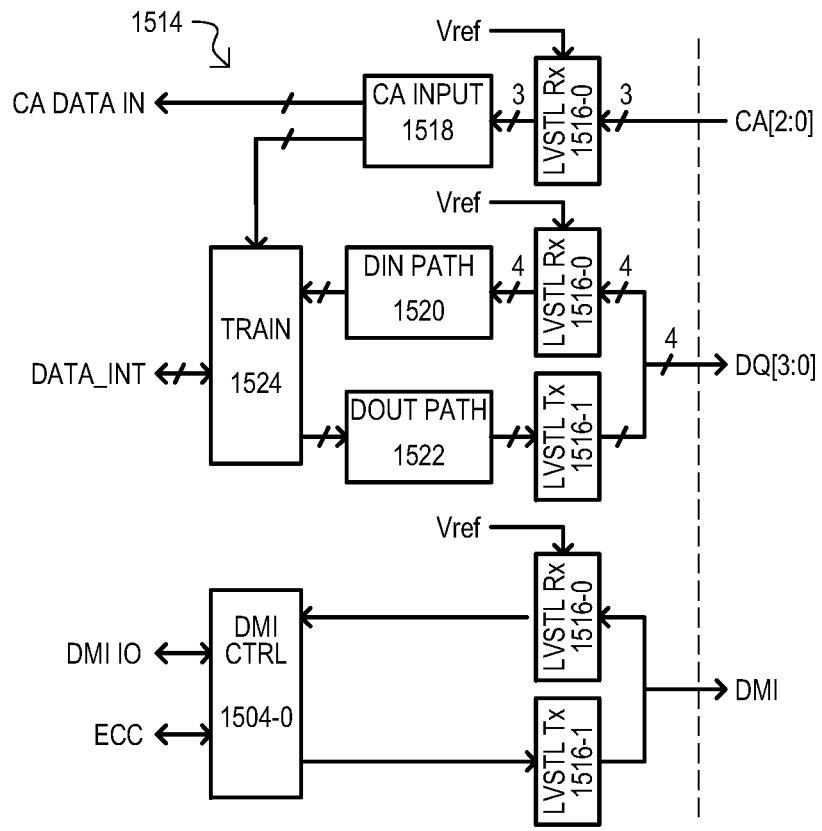
FIG. 15 is a block diagram of interface circuits according to an embodiment.

FIG. 15 is a block diagram of interface circuits 1514 that can be included in embodiments. Interface circuits can include physical receiver circuits 1516-0 and physical transmitter circuits 1516-1, CA input circuits 1518, data in path circuits 1520, data out path circuits 1522, training path circuits 1524, and DMI control circuits 1526. In some embodiments, receiver and transmit circuits 1516-0/1 can be low voltage swing terminated logic (LVSTL) circuits.

CA input circuits 1518 can receive three bit values from CA[2:0] inputs and provide such values as CA DATA IN. In some embodiments, CA DATA IN can be six bit input values formed by two, 3-bit input values. In some embodiments, CA input circuits 1518 can also provide data from CA[2:0] to training path circuits 1524.

Data in path circuits 1520 can receive 4-bit data values from DQ[3:0] and provide such values as internal data DATA_INT. Data out path circuits 1522 can receive output data from DATA_INT, and provide such data as 4-bit data values on DQ[3:0]. In some embodiments, DATA_INT can be a larger multiple of four-bits, such as 8-bit, 16-bit, etc. Training path circuits 1524 can selectively connect data received on CA[2:0] inputs to data out path circuits 1522, such as in a CA training mode.

DMI control circuits 1504-0 can enable a DMI IO to provide various functions in addition to data masking and data inversion, including but not limited to, providing ECC data for read and write operations, indicating an upper or lower nibble value for read or write data on DQ[3:0], or indicating if DQ[3;0] is to transmit or receive data. DMI control circuits 1504-0 can receive output DMI values and provide DMI input values (DMI IO), and can provide and/or receive ECC data.

Figure 16A:
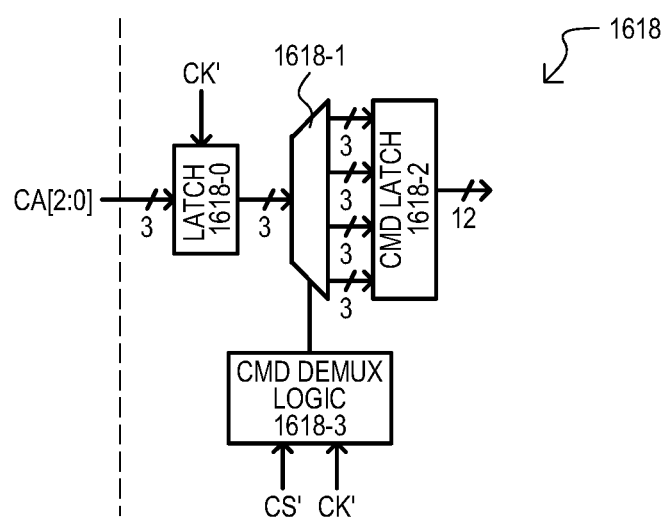
FIGS. 16A to 16E are diagrams of various interface circuits according to embodiments.

FIG. 16A is a schematic diagram of a CA input circuit 1618 according to an embodiment. A CA input circuit 1618 can include an input latch 1618-0, input de-multiplexer (deMUX) 1618-1, deMUX logic 1618-3, and command latch 1618-2. An input latch 1618-0 can latch 3-bit values from CA[2:0] in response to clock signal CK', which can be generated in response to a CK input (as possibly other input states, such as CS). In response to deMUX logic 1618-3, deMUX 1618-2 can selectively pass 3-bit values to different locations of command latch 1618-2. Command latch 1618-2 can form 12-bit commands, which can be processed by command decoder circuits, or the like. DeMUX logic 1618-3 can generate signals for clocking in 3-bit portions of CA[2:0] to form 12-bit commands.

While the embodiment of FIG. 16A shows an arrangement in which 3-bit values are translated into 12-bit values for processing by command decoding circuits or the like, such an embodiment should not be construed as limiting. Alternate embodiments can include devices which command decoding circuits that operate on 3-bit portions of commands.

Figure 16B:
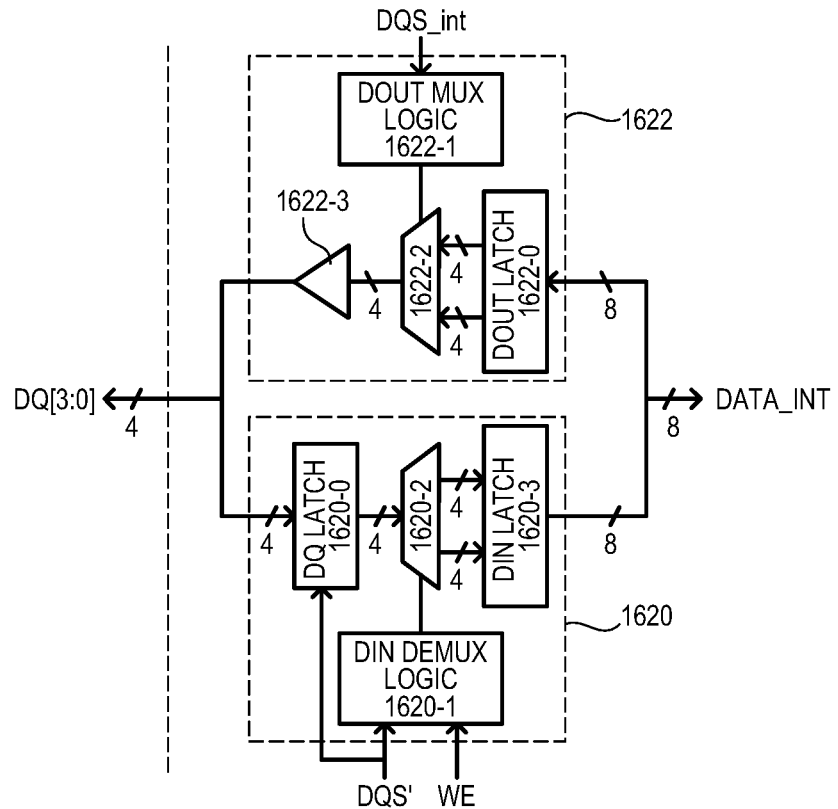

FIG. 16B is a schematic diagram of data paths 1620/1622 according to an embodiment. In the embodiment shown, data input path 1620 can include a DQ latch 1620-0, input data control logic 1620-1, an input deMUX 1620-2, and an input data latch 1620-3. DQ latch 1620-0 can latch 4-bit values from DQ[3:0] in response to a signal DQS', which can be generated in response to an input data strobe and other signals. In response to input deMUX logic 1620-1, input deMUX 1620-2 can selectively pass 4-bit values to different locations of an input latch 1620-3. Input data latch 1620-3 can form 8-bit data values, which may or may not form part of larger data values.

Data output path 1622 can include an output data latch 1622-0, output data control logic 1622-1, an output MUX 1622-2, and an output driver 1622-3. Output data latch 1622-0 can store 8-bit values for output on DQ[3:0]. In response to output MUX logic 1622-1, output MUX 1622-2 can selectively pass 4-bit values from different locations of output latch 1620-0 as output data. Such data values can be driven by output driver 1622-3 on DQ[3:0].

Figure 16C:
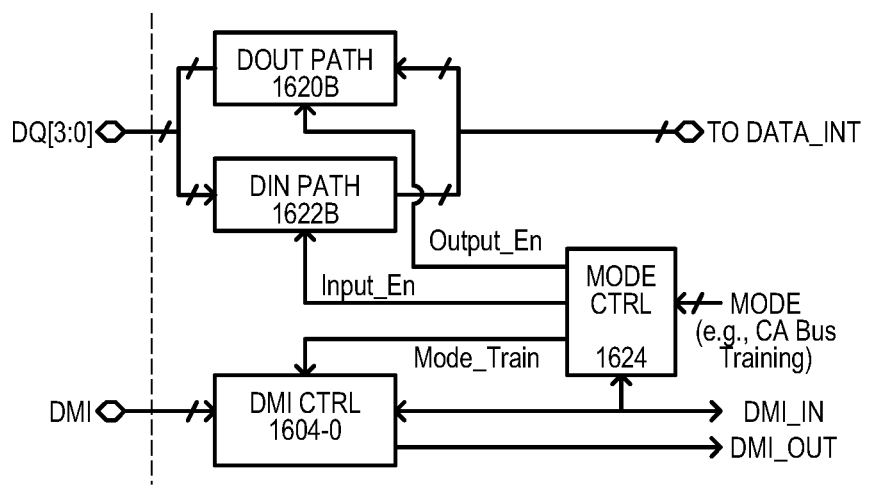

According to embodiments, in some operations (such as that shown in FIG. 6C), a DMI IO can indicate a status of DQ[3:0] IOs. FIG. 16C is a schematic diagram showing one such embodiment. FIG. 16C includes a data out path circuits 1620B, data in path circuits 1622B, DMI control circuits 1604-0 and mode control circuits 1624. Data out path circuits 1620B can provide data for output on DQ[3:0] and can be enabled or disabled by mode control circuits 1624. Data in path circuits 1622B can receive data at DQ[3:0] as input data and can also be enabled by mode control circuits 1624.

DMI control circuits 1604-0 can receive an input DMI signal and provide an output DMI signal. In addition, in response to mode control circuits 1624 detecting a low DMI input signal, data in path circuits 1622B can be enabled to receive input data (e.g., calibration values) on DQ[3:0] (and possible on a CA bus as well). Subsequently, DMI control circuits 1604-0 can generate a DMI output signal that indicates DQ[3:0] are providing output data (e.g., test patterns received on a CA bus).

Figure 16D:
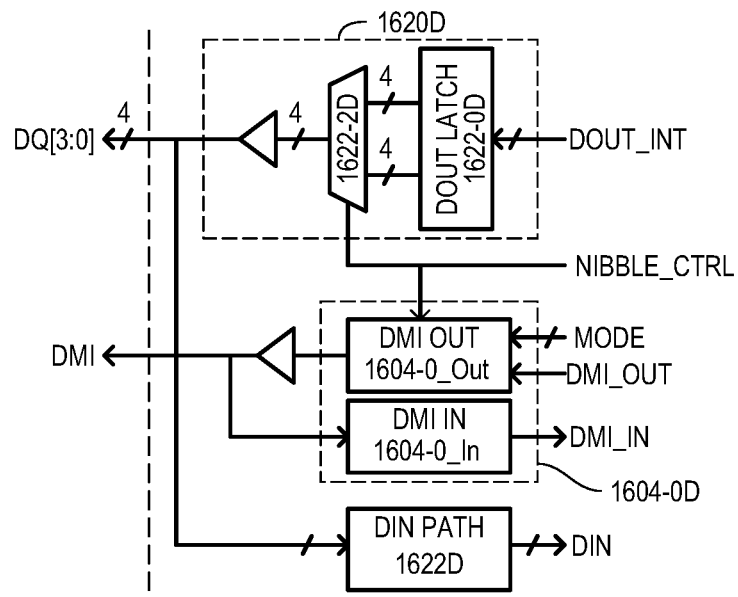

According to embodiments, in some operations (such as those shown in FIGS. 6A and 7), a DMI IO can indicate a significance of an output nibble on DQ[3:0] IOs. FIG. 16D is a schematic diagram showing one such embodiment. FIG. 16D includes a data out path circuits 1620D, data in path circuits 1622D, and DMI control circuits 1604-0. Data out path circuits 1620D can provide data for output on DQ[3:0] as described for FIG. 16B, with 4-bit data values being MUXed out in response to a NIBBLE_CTRL signal. Data in path circuits 1622B can receive data at DQ[3:0] according to any of the embodiments herein, or equivalents.

DMI control circuits 1604-0D can include an output portion 1604-0_Out that provides an output DMI signal, and an input portion 1604-0_In that receives an input DMI signal. In addition, in response to mode control signals MODE, output portion 1604-0_Out can generate a DMI output signal that indicates a nibble significance and/or change in nibble value of data on DQ[3:0] IOs. Similarly, input portion 1604-0_In can receive input DMI signals that indicates a nibble significance and/or change in nibble value of data on DQ[3:0] IOs. As but two of many possible examples, in one type of calibration operation, an input DMI signal can have one value (e.g., low) to indicate lower significant bits of an input reference value on DQ[3:0], then subsequently another value (e.g., high), to indicate the presence of higher significance bits of the input reference value on DQ[3:0]; and in another type of calibration operation, an output DMI signal can be generated having one value (e.g., low) when less significant bits of an output value are driven on DQ[3:0], and another value (e.g., high), when more significant bits of the output value are driven on DQ[3:0].

Figure 16E:
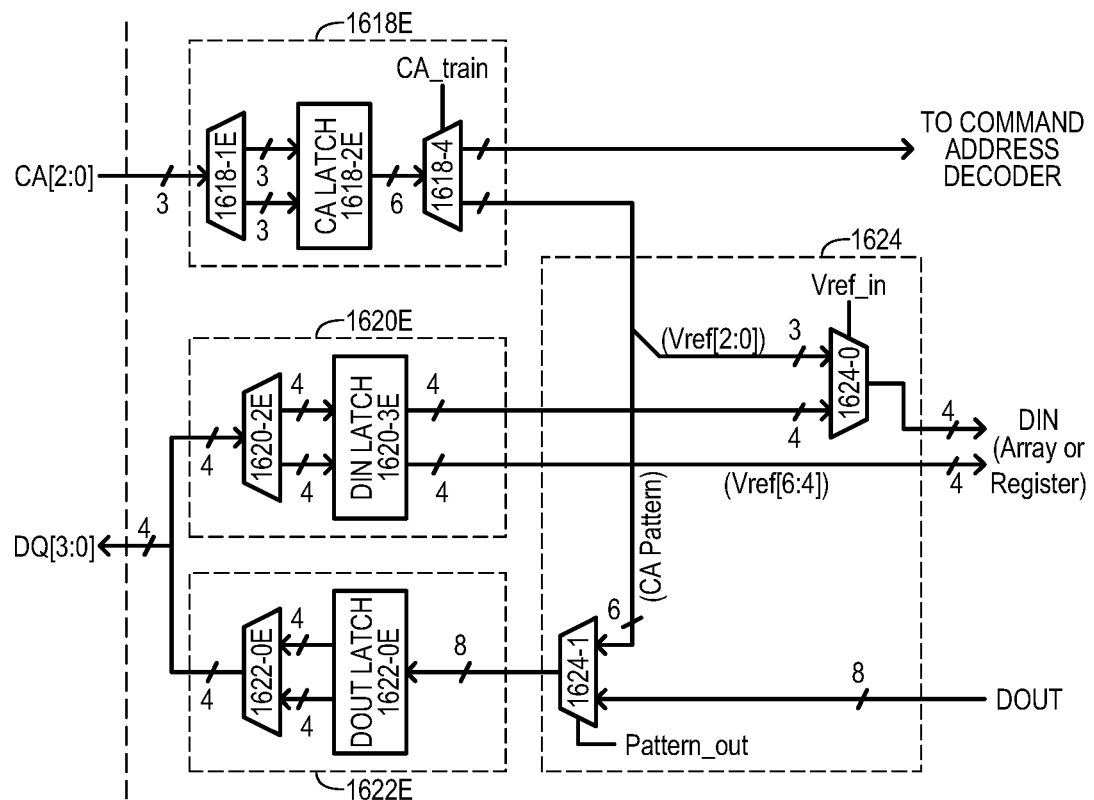

According to embodiments, in some operations (such as those shown in FIG. 6C), data received on CA[2:0] can be combined with data received on DQ[3:0] to form a reference value (e.g., Vref[5:0]). FIG. 16E is a schematic diagram showing one such embodiment. FIG. 16E includes CA input circuits 1618E, a data in path circuits 1620E, data out path circuits 1622E, DMI control circuits 1604-0E, and training path circuits 1624. Data in path circuits 1620E can receive data input values as described herein and equivalents. Data out path circuits 1622E can provide data output values as described herein and equivalents.

CA input circuits 1618E can receive 3-bit CA[2:0] values and provide them to a command and/or address decoder. However, in addition, CA input circuits 1618E can include circuits 1618-4 that provide CA[2:0] input values to training path circuits 1624.

In some embodiments, training path circuits 1624 can include circuits 1624-1 for selectively providing data from CA[2:0] (e.g., CA Pattern) as output data on data out path circuits 1620E. In some embodiments, training path circuits 1624 can include circuits 1624-0 for selectively providing data from CA[2:0] (e.g., Vref[2:0]) as a portion of a reference value, with DQ[3:0] providing another portion of the reference value (e.g., Vref[6:4]).

While the embodiments of FIGS. 16B to 16E shows arrangements in which 4-bit values on DQ[3:0] are translated into 8-bit values for transfer on internal data buses, such an embodiment should not be construed as limiting. Alternate embodiments can include devices having native narrow (e.g., 3-bit CA, 4-bit data) internal buses.

Figure 17A:
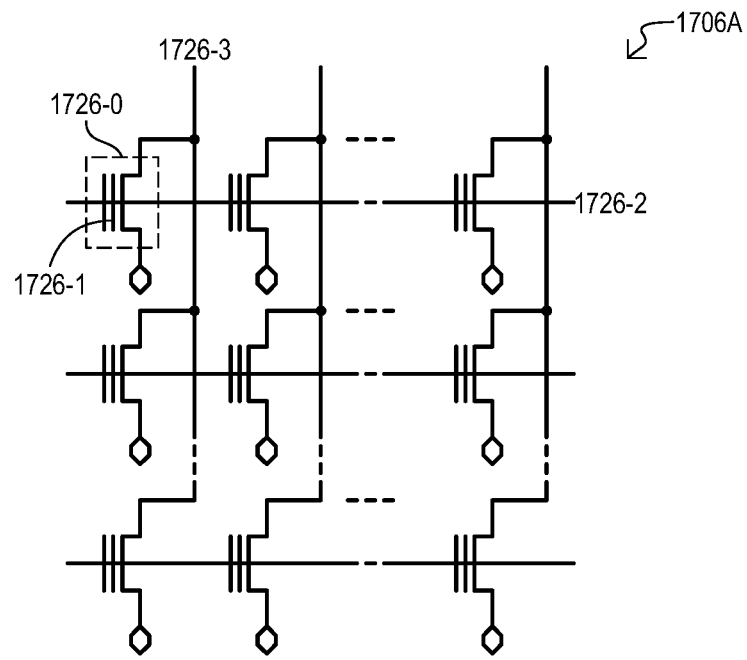
FIGS. 17A and 17B are diagrams of memory cell arrays that can be included in embodiments.

While embodiments can include any suitable memory cell array structure, some embodiments can include 1-transistor (1T) NOR type arrays. FIG. 17A is a schematic diagram of a 1T NOR array 1706A that can be included in embodiments. Array 1706A can include a number of memory cells (one shown as 1726-0) arranged into rows and columns, with memory cells of a same row being connected to a same word line (one shown as 1726-2) and memory cells of a same column being connected to a same bit line (one shown as 1726-3). In some embodiments, memory cells (1726-0) can be formed with a single transistor structure, having a charge storing structure 1726-1 between a control gate and a channel. A charge storing structure 1726-1 can store one or more bits of data as charge (including absence of charge). A charge storing structure 1726-1 can take any suitable form including but not limited to: a floating gate, a charge storing dielectric (e.g., replacement gate), or a combination thereof.

Figure 17B:
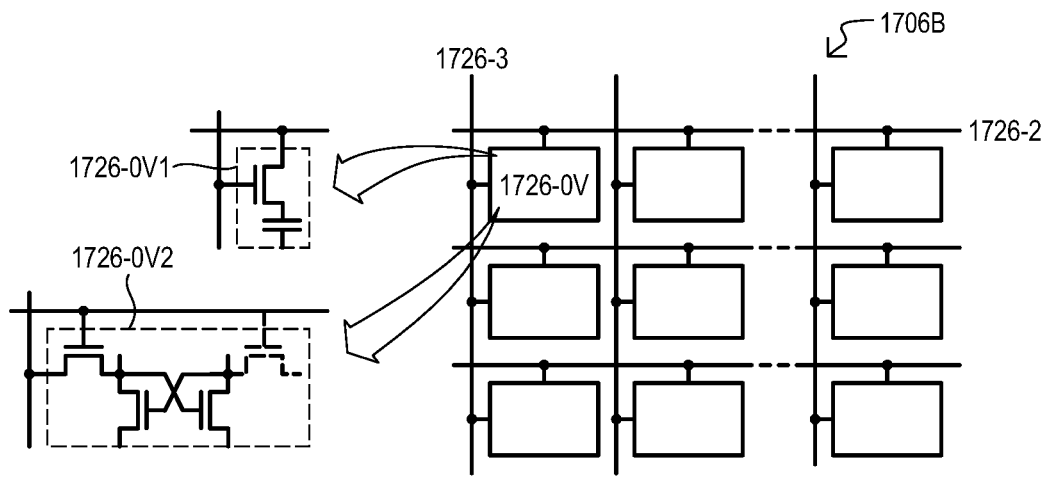

While embodiments can include nonvolatile memory cells, embodiments can also include any suitable volatile array structure or volatile memory cell type. FIG. 17B is a schematic diagram of possible volatile memory cells arrays that can be included in embodiments. FIG. 17B shows an array 1706B that can include a number of volatile memory cells (one shown as 1726-0V) arranged into rows and columns and connected to one or more bit lines (e.g., 1726-3) and word lines (e.g., 1726-2). Volatile memory cells can take any suitable form, including but not limited to DRAM cells 1726-0V1 and/or SRAM cells 1726-0V2. SRAM cells 1726-0V2 can include, but are not limited to, 4-transistor (4T), 6T and/or 8T variations.

Figure 18:
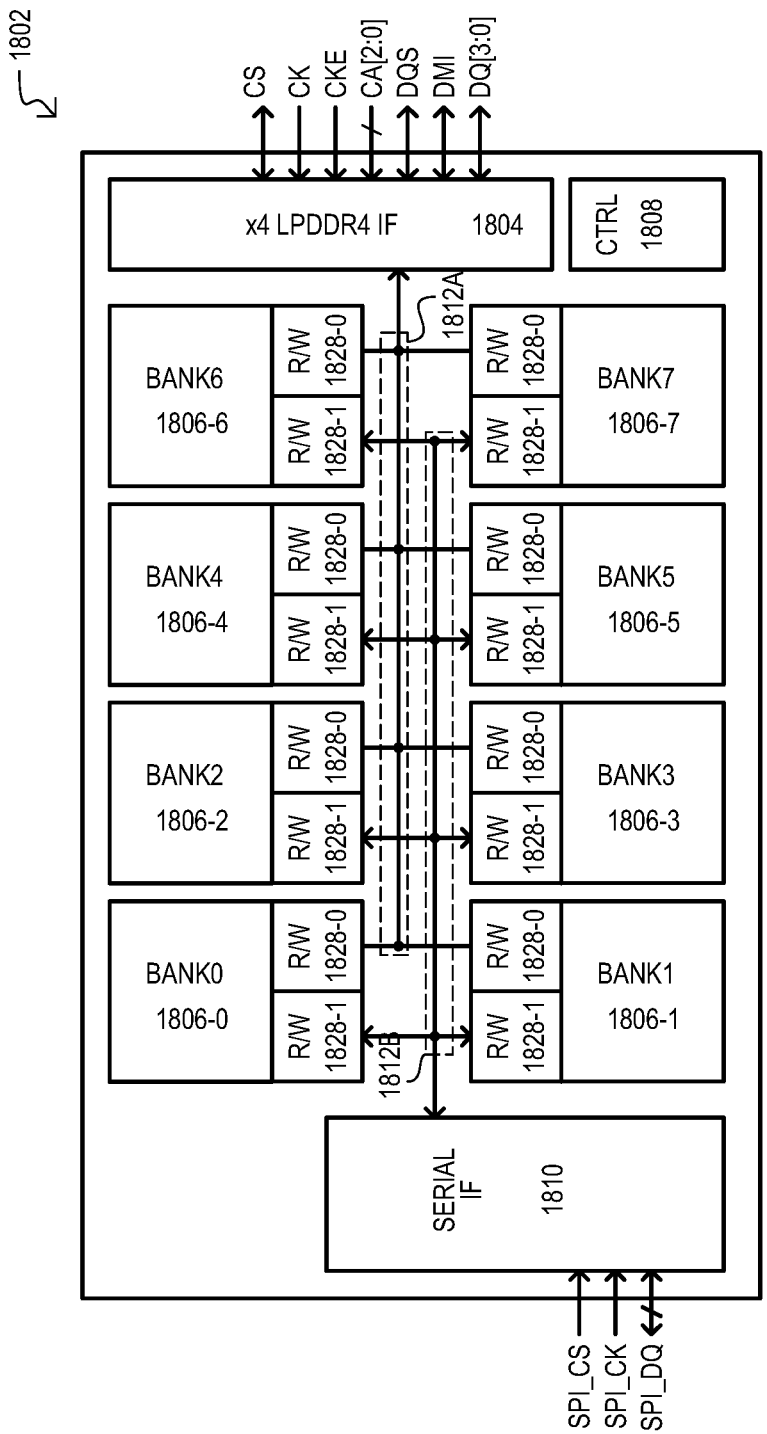
FIG. 18 is a block diagram of a memory device according to a further embodiment.

FIG. 18 is a block diagram of a NVM device 1802 according to a further embodiment. NVM device 1802 can be one implementation of any of those shown herein. NVM device 1802 can include a x4 LPDDR4 IF 1804, multiple bank 1806-0 to -7, control circuits 1808, and a quad SPI (QSPI) compatible IF 1810. x4 LPDDR4 IF can include a CS input, a CK input, a CKE input, CA[2:0] inputs, a DQS IO, DMI IO and DQ[3:0] IOs. In some embodiments, x4 LPDDR IF can have signaling requirements compatible with the LPDDR4 standard (JESD209-4D), but receive commands on a reduced CA bus size, and provide data on a reduced DQ bus size, as described herein, or an equivalent. In some embodiments, x4 LPDDR4 IF 1804 can have differential signaling, including any of differential clock inputs (CK_t, CK_c) or differential data strobes (DQS_t, DQS_c).

In some embodiments, each bank (1806-0 to -7)) can include NVM cells arranged into rows and columns. Each bank (1806-0 to -7) can be separately accessible via a unique bank address. In some embodiments, NVM cells can be group erasable (e.g., flash type cells). First bank access circuits 1828-0 can enable read and write accesses to their corresponding banks (1802-0 to -7) from x4 LPDDR4 IF 1804 via first bus system 1812A. Second bank access circuits 1828-1 can enable read or write accesses to their corresponding bank (1802-0 to -7) from QSPI IF 1810 via second bus system 1812B. Different bank access circuits 1828-0/1 can enable simultaneous access to different banks via different interfaces 1804/1810.

Control circuits 1808 can control operations of device 1802 and include any of the control circuit features described herein, including those shown in FIG. 13.

QSPI IF 1810 can include a serial chip select SPI_CS, a serial clock input SPI_CK, and four serial data IOs SPI_DQ. Such IOs can be connected to a SPI compatible serial bus. QSPI IF 1810 can process commands received VIA SPI_DQ. Such commands can include both read and write (e.g., program, erase) commands.

While embodiments can include devices, circuits and corresponding methods and operations, embodiments can also include systems having devices with reduced pin count interfaced connected to one another with small, high performance buses. One such embodiment is shown in FIG. 19.

Figure 19:
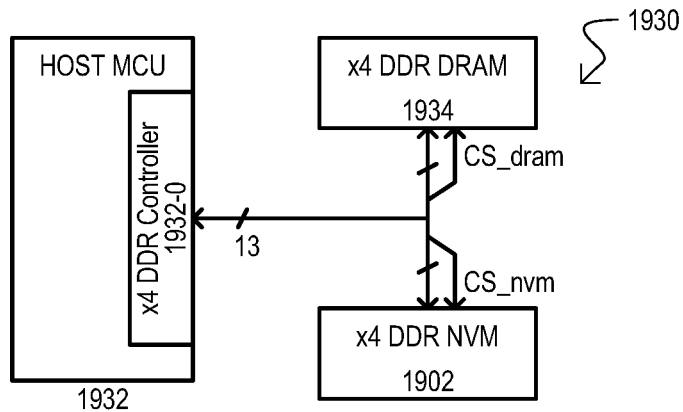
FIG. 19 is a block diagram of a system according to an embodiment.

FIG. 19 is a block diagram of a system 1930 according to an embodiment. A system 1930 can include a host microcontroller (MCU) 1932, a first memory device 1902 and a second memory device 1934. A host memory device 1932 can include a x4 DDR4 controller (controller) 1932. Controller 1932 can be connected to DDR bus 1936, which can include signal lines according to any of the low pin count interfaces described herein. DDR bus 1936 can include a CS input for each device (CS_dram, CS_nvm). While FIG. 19 shows a bus of size 13, which can correspond to a device like that shown in FIG. 1B, alternate embodiments can include smaller or larger bus sizes.

A first memory device 1902 can be a NVM device having a low pin count according to any of the embodiments herein. A second memory device 1934 can be an NVM device having a low pin count according to any of the embodiments herein. In this way, a system 1930 can include volatile and nonvolatile storage, while also include high performance signaling on a reduced size bus.

Figure 20:
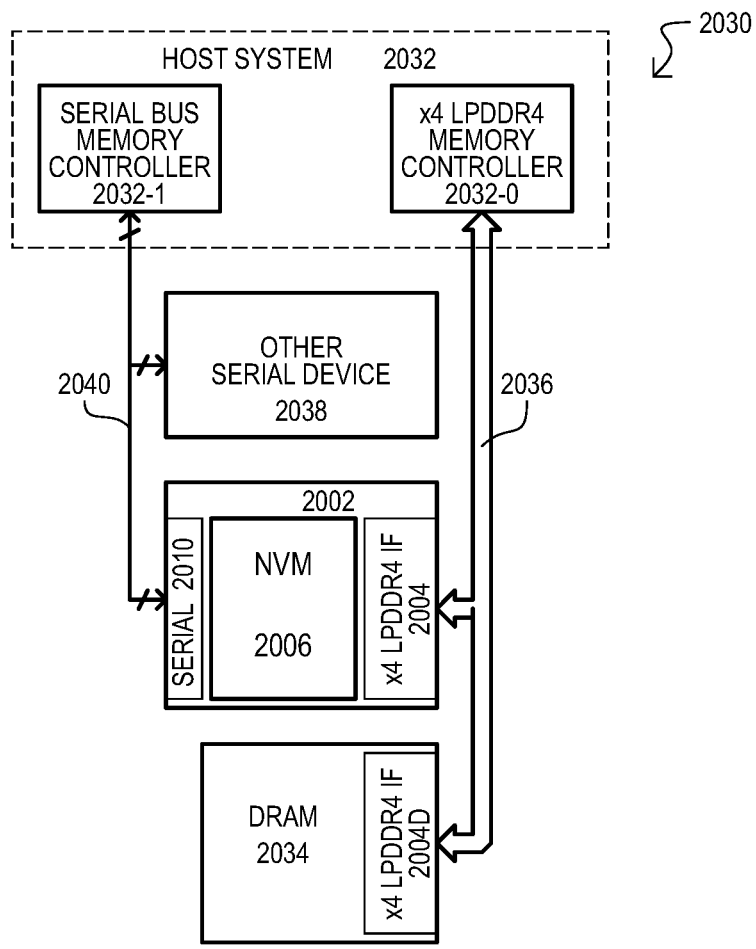
FIG. 20 is a block diagram of a system according to another embodiment.

FIG. 20 is a block diagram of another system 2030 according to an embodiment. A system 2030 can include a host system 2032, a x4 LPDDR bus 2036, a serial bus 2040, and a number of other devices, three shown as 2002, 2034, 2038. A host system 2032 can include a x4 LPDDR4 memory controller (MC) 2032-0 and a serial bus MC 2032-1. An x4 LPDDR4 MC 2032-0 can access devices over the x4 LPDDR4 bus 2036 by issuing commands and data according to embodiments disclosed herein, or equivalents. x4 LPDDR4 bus 2036 can include a reduced size CA bus (i.e., no more than five) and a reduced size DQ bus (i.e., no more than six) according to embodiments disclosed herein and equivalents. A serial bus MC 2032-1 can access devices over serial bus 2040 according to any suitable serial communications protocol.

Device 2002 can be a NVM device with NVM array(s) 2006, and can be connected to x4 LPDDR bus 2036 via x4 LPDDR IF 2004, and to serial bus 2040 via serial bus IF 2010. A device 2002 can take the form of any of those described herein and equivalents. Device 2034 can be a DRAM device, and can be connected to x4 LPDDR bus 2036 via x4 LPDDR IF 2004D. Device 2038 can be a serial device 2038 connected to serial bus 2040.

x4 LPDDR4 MC 2032-0 can issue commands (and possibly) data to devices 2002 or 2034 as described herein, or equivalents.

Figure 21:
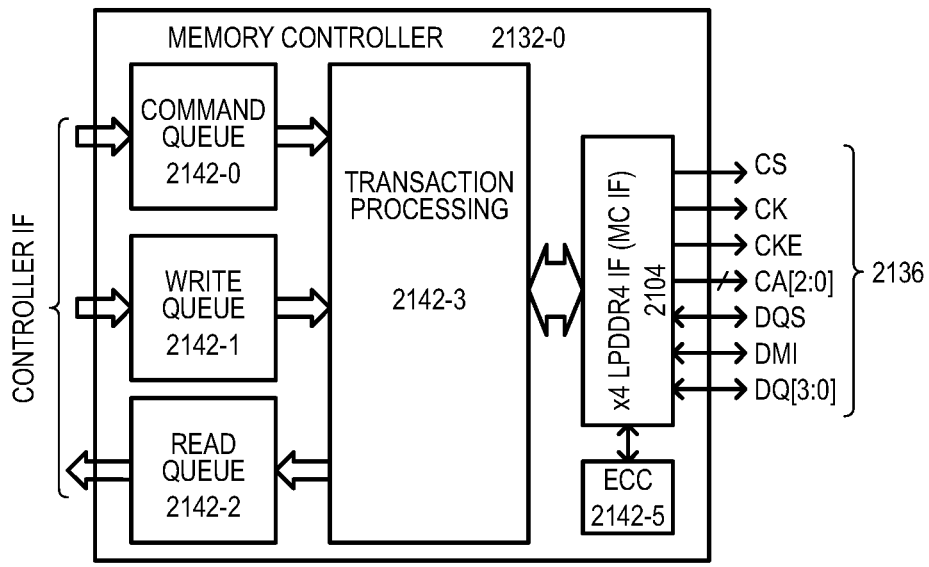
FIG. 21 is a block diagram of a memory controller according to an embodiment.

While embodiments can include devices, systems, and corresponding method, embodiments can also include memory controllers that can generate commands, address and data values over a x4 LPDDR I/F as described herein and equivalents. FIG. 21 shows a memory controller 2132-0 according to such an embodiment.

A memory controller 2132-0 can include a command queue 2142-0, a write queue 2142-1, a read queue 2142-2, transaction processing circuits 2142-3, a MC IF 2104, and ECC circuits 2142-5. A command queue 2142-0, a write queue 2142-1, and read queue 2142-2 can be connected to a controller IF, which can be connected to a controller (e.g., host processor) or the like. A command queue 2142-0 can receive memory requests over a controller IF to access a memory device, or perform other operations (such as calibration or training). A write queue 2142-1 can receive write data to be written over MC IF 2104. A read queue 2142-2 can provide read data received from MC IF 2104.

Transaction processing circuits 2142-3 can encode requests into commands having predetermined bit values. In some embodiments, this can include encoding commands into 12-bit commands composed of two, 6-bit portions. In some embodiments, such commands can be compatible with the LPDDR4 standard (JESD209-4D). Transaction processing circuits can also format write data for output and read data received over x4 LPDDR4 IF2104.

MC IF 2104 can generate commands as described herein and equivalents. In some embodiments, MC IF 2104 can receive 12-bit commands, and output them as four, 3-bit values on CA[2:0]. Data values can be received and transmitted in nibbles on DQ[3:0]. A MC IF 2104 can enable a DMI signal on DMI IO to provide indications in addition to masking and inversion, as described herein, or equivalents. This can include, but is not limited to: encoding ECC data with inversion data; indicating an input or output state for DQ[3:0]; or indicating upper or lower nibbles of an 8-bit value on DQ[3:0].

Figure 22A:
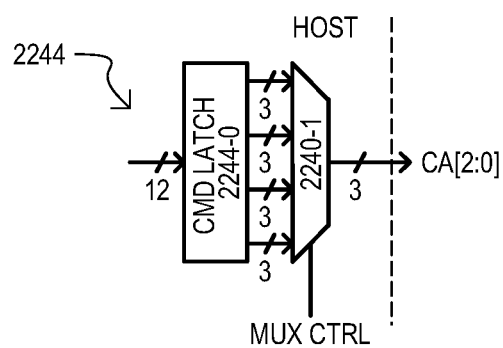
FIGS. 22A and 22B are diagrams of memory controller circuits according to embodiments.

FIG. 22A is a schematic diagram of a CA output circuit 2244 for a host device according to an embodiment. A CA output circuit 2244 can include an output latch 2244-0 and output MUX 2240-1. An output latch 2240-0 can latch 12-bit commands. MUX 2240-1 can output such 3-bit portions on CA[2:0]. In some embodiments, 12-bit command values can be issued in four 3-bit portions on consecutive rising edges of a timing clock (e.g., CK).

Figure 22B:
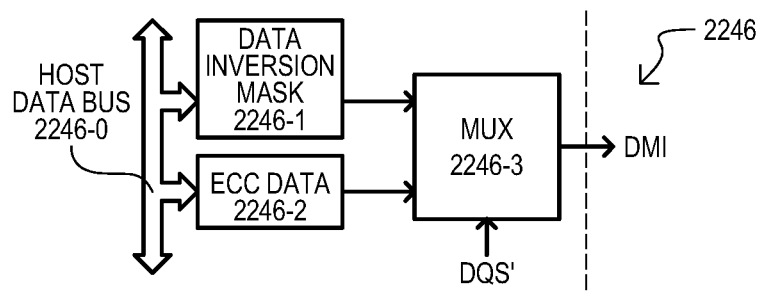

FIG. 22B is a schematic diagram showing MC DMI circuits 2246 according to an embodiment. MC DMI circuits 2246 can generate a DMI output value on a DMI IO which can include inversion data with ECC data in a same cycle of a timing clock. MC DMI circuits 2246 can include store 2246-1 for inversion or mask data, and store 2246-2 for storing ECC data 2246-2. Stores 2246-0/1 can be registers or latches, or the like. MUX 2246-3 can selectively output ECC data or DMI data that includes inversion and/or mask data. In some embodiments, such MUXing can include providing mask/inversion data during one half of a timing clock, and ECC data during the other half of the timing clock, such as that shown in FIG. 5C, as but one example.

Figure 23:
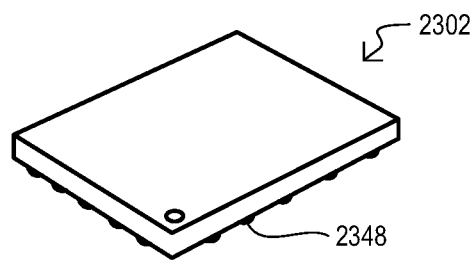
FIG. 23 is a diagram of an integrated circuit device according to an embodiment.

While embodiments can include systems with memory devices operating in conjunction with a host device, embodiments can also include standalone devices having a reduced pin count interface, as described herein and equivalents. Such an embodiment is shown in FIG. 23. FIG. 23 shows a packaged memory device 2303 in a perspective top view. Memory device 2302 can take the form of any of those described herein, or equivalents. In some embodiments, memory device 2302 can include a single integrated circuit die. Memory device 2302 can include a number of physical connections (e.g., pins), one shown as 2348. In some embodiments, a memory device 2302 can provide high speed LVSTL signaling, but with relatively low pin counts as described herein.

Figure 24:
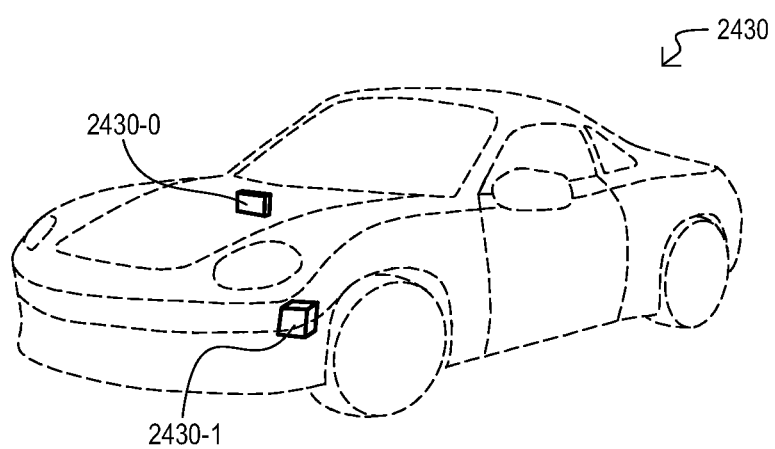
FIG. 24 is a diagram of an automobile system according to an embodiment.

Referring to FIG. 24 an automobile system 2430 according to an embodiment is shown in a diagram. An automobile system 2430 can have numerous sub-systems (two shown as 2430-0 and 2430-1). Sub-systems 2430-0/1 can operate with host devices (e.g., CPU subsystems) that communicate with one or more memory devices. Such sub-systems 2430-0/1 can include an electronic control unit (ECU) and/or an advanced driver assistance system (ADAS). However, in other embodiments such sub-systems can include a dashboard display/control sub-system and/or an infotainment sub-system, as but two of numerous possible examples. Each subsystem 2430-0/1 can include a host device that can access memory devices over a reduced size memory bus, such as those described herein. That is, host devices can have a low-pin count interface, and memory devices can be low pin count memory devices. In some embodiments, host devices can be configured to execute code directly from NVM memory devices, and can benefit from the high speed data transfer rates, such as those compatible with LPDDR4 signaling.

While the described devices and systems disclose various methods according to embodiments, additional methods will be described with reference to flow diagrams.

Figure 25:
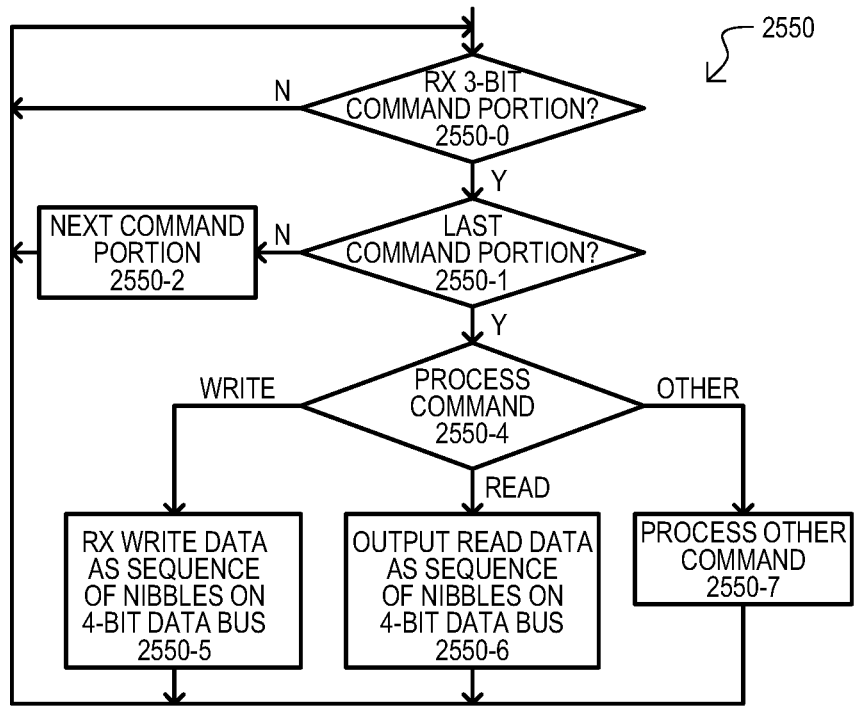
FIG. 25 is a flow diagram of a method of operating a memory device according to embodiments.

FIG. 25 is a flow diagram of a method 2550 of operation for a memory device according to an embodiment. A method 2550 can include receiving 3-bit portions of a command 2550-0. In some embodiments, this can include latching different command portions on rising edges of a timing clock. While a last portion of a command has not been received (N from 2550-1), a next command portion 2550-2 can be received. When a last command portion has been received (Y from 2550-1), the received command can be processed 2550-4. In some embodiments, commands can be 12-bit commands, and receiving a last command portion can include receiving a fourth 3-bit portion.

If the command is a write command (WRITE from 2550-4), a method 2550 can include receiving write data as a sequence of 4-bit nibbles on a 4-bit data bus 2550-5. In some embodiments, command portions can be received on rising and falling edges of a timing clock signal, and 4-bit values can be received in synchronism with rising and falling edges of the timing clock signal (i.e., DDR fashion). If the command is a read command (READ from 2550-4), a method 2550 can output read data as a sequence of 4-bit nibbles on a 4-bit data bus 2550-6. In some embodiments, such values can be output in a DDR fashion. If the command is some other type of command, the command can be processed 2550-7. In some embodiments, this can include processing calibration/training operations as described herein.

Figure 26:
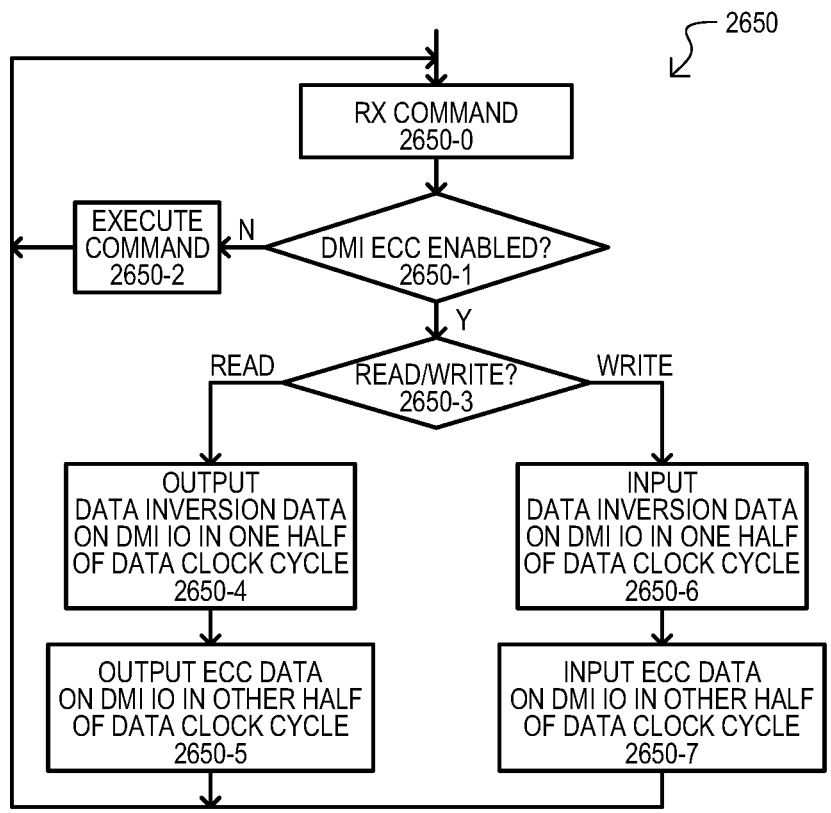
FIG. 26 is a flow diagram of a method providing error correction code data according to embodiments.

FIG. 26 is a flow diagram of a method 2650 for providing ECC data with inversion data on a DMI IO according to an embodiment. In some embodiments a method 2650 can be executed by a memory device. A method 2550 can include receiving a command 2650-0. Such an action can include receiving commands according to embodiments described herein or equivalents, including receiving multiple command portions on a reduced size CA bus on three or more clock cycle transitions.

A method 2650 can determine if DMI ECC is enabled 2560-1. Such an action can include, but is not limited to, having a configuration register programmed to a predetermined value, having a particular device ID, or having a received command indicate that a DMI signal is to have an ECC function. If DMI ECC is not enabled (N from 2650-1), a method 2650 can execute the command 2650-2.

If DMI ECC is enabled (Y from 2650-1), a method 2650 can determine if the command is a read or write command 2650-3. If the command is a read command (READ from 2650-3), inversion data can be output on a DMI IO during one half of a data clock cycle 2650-4, and ECC data can be output on other half of the data clock cycle 2650-5. In some embodiments, such inversion data and ECC data can correspond to data being output on data IOs (e.g., DQ[3:0]). If the command is a write command (WRITE from 2650-3), inversion data can be received on a DMI IO during one half of a data clock cycle 2650-6, and ECC data can be received on other half of the data clock cycle 2650-7. In some embodiments, such inversion data and ECC data can correspond to data being received on data IOs.

Figure 27:
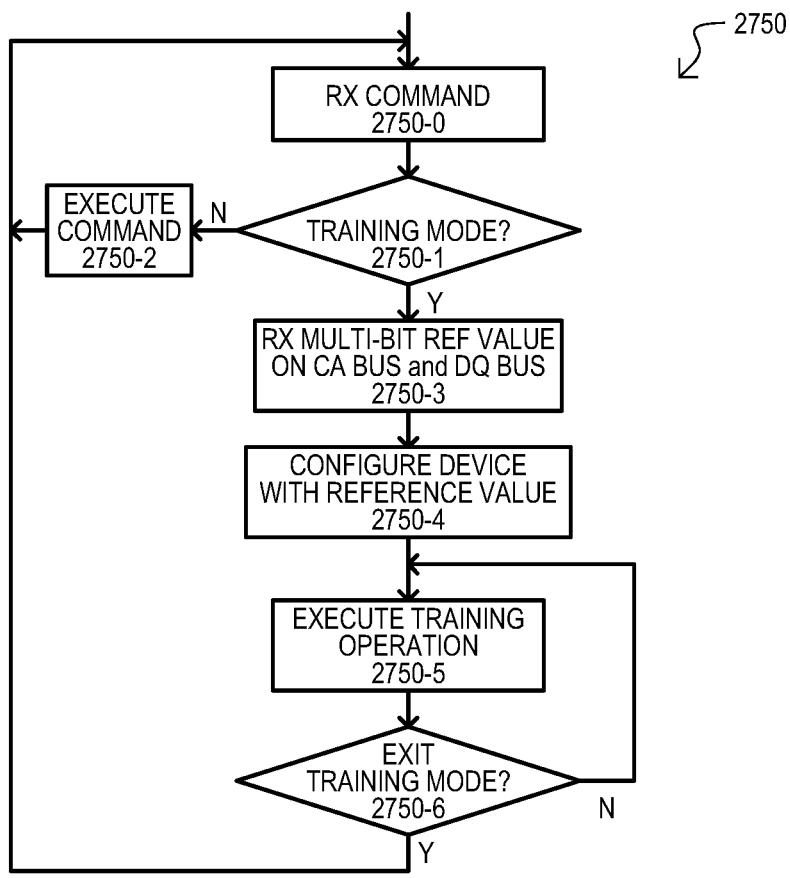
FIG. 27 is a flow diagram of a method of training a memory device according to an embodiment.

FIG. 27 is a flow diagram of a method 2750 for training inputs or outputs of a memory device according to an embodiment. A method 2750 can include receiving a command 2750-0. Such an action can include any of those described herein, or equivalents. A method 2750 can determine if a received command indicates a training mode 2750-1. In some embodiments, such an action can include decoding a command to determine if the command indicates a training mode that anticipates reception of one or more reference values. As but one of many possible actions, such an action can determine if a command is placing a memory device into a CA bus training mode or a DQ training mode. If a training mode is not entered (N from 2750-1), a method 2750 can execute the received command 2750-2.

If a training mode is entered (Y from 2750-1), a method 2750 can include receiving a multi-bit reference value on both a CA bus and a DQ bus 2750-3. In some embodiments, such an action can include receiving a first portion of a reference value on a CA bus, and a remaining portion of the reference value on the DQ bus. In some embodiments, different portions of the same reference value can be received at the same time on the CA and DQ buses. In some embodiments, a reference value can be for a reference voltage used in a CA bus training operation.

A method 2750 can include configuring a device with the reference value 2750-4. In some embodiments, such an action can include generating an analog value from the bits of the reference value. In some embodiments, a reference voltage can be generated from the bits of the reference value.

A method 2750 can execute training operations 2750-5. Such an action can include providing additional inputs to, or requesting additional outputs from a memory device. In some embodiments, such an action can include applying test patterns as inputs to a CA bus, then receiving such values as received by the memory device on a DQ IO bus. Training operations can continue (N from 2750-6) until a training mode is exited 2750-6. In some embodiments, exiting a training mode an include receiving predetermined commands. However, in other embodiments, a training mode can be exited after a predetermined time period.

Figure 28:
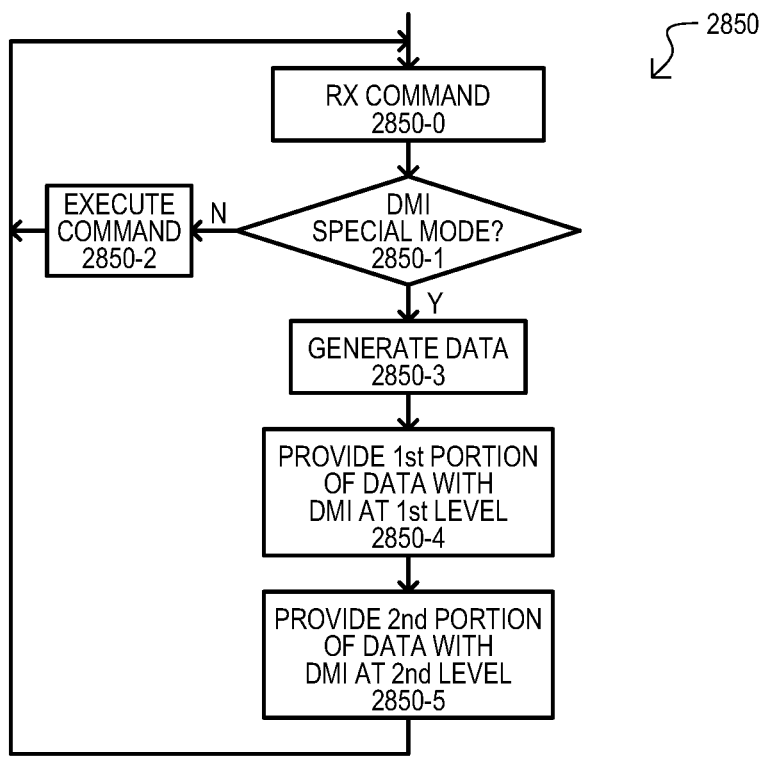
FIG. 28 is a flow diagram of a method for indicating data output portions with a data mask inversion (DMI) signal according to an embodiment.

FIG. 28 is a flow diagram of a method 2850 for indicating portions of an output data value using a DMI signal according to embodiments. Such a method can be executed by a memory device, a command issuing device (e.g., memory controller), or a combination thereof. A method 2850 can include receiving a command 2850-0. Such an action can include any of those described herein, or equivalents. A method 2850 can determine if a received command indicates a special DMI mode 2850-1. In some embodiments, such an action can include decoding a command. As but one of many possible actions, such an action can determine if a command is placing a memory device into a CA bus training mode. If a special DMI mode is not entered (N from 2850-1), a method 2850 can execute the received command 2850-2.

If a training mode is entered (Y from 2850-1), a method 2850 can include generating data 2850-3. Such an action can include a memory device generating data for output on a data bus, or a command issuing device generating data for input to the memory device. A first portion of the data can be provided with a DMI IO at a first level 2850-4, and a second portion of the data can be provided with a DMI IO at a second level 2850-5. DMI levels can be established by a memory device, command issuing device, or combinations thereof.

Figure 29:
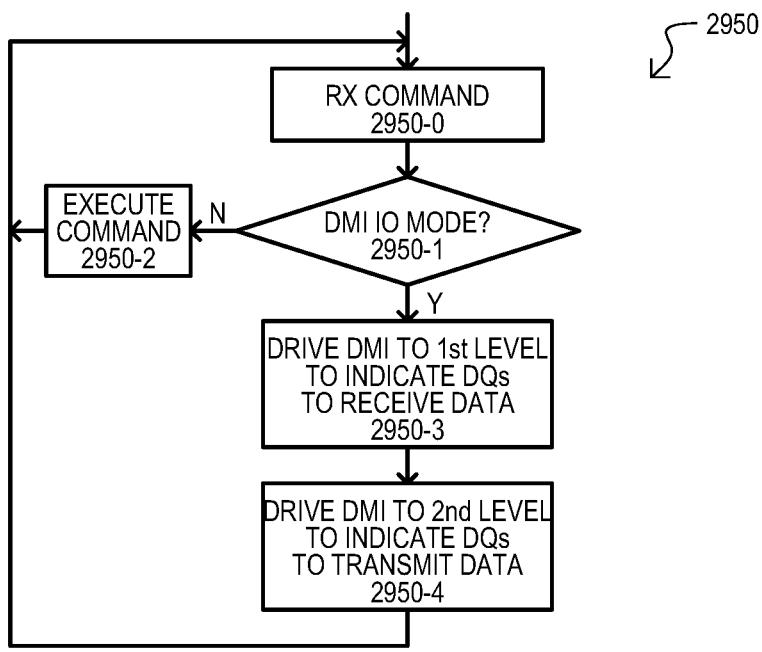
FIG. 29 is a flow diagram of a method for indicating data bus configuration with a DMI signal according to an embodiment.

FIG. 29 is a flow diagram of a method 2950 for indicating a status (i.e., input or output) of a bidirectional data bus with a DMI signal according to embodiments. Such a method can be executed by a memory device, a command issuing device, or combination thereof. A method 2950 can include receiving a command 2950-0. Such an action can include any of those described herein, or equivalents. A method 2950 can determine if a received command indicates a special DMI IO mode 2950-1. In some embodiments, such an action can include decoding a command. As but one of many possible actions, such an action can determine if a command is placing a memory device into a CA bus training mode. If a special DMI IO mode is not entered (N from 2950-1), a method 2750 can execute the received command 2950-2.

If a special DMI IO mode is entered (Y from 2950-1), a method 2950 can include driving a DMI IO to a first level to indicate DQs are to receive data 2950-3. Such an action can include driving a single DMI IO to one level, to indicate that data are to be received on a DQ[3:0] data bus. In some embodiments, such an action can include a command issuing device driving DMI to the first level to indicate that reference values are present on a DQ bus and/or CA bus. A method 2950 can also include driving a DMI IO to second level to indicate that DQs are outputting data. In some embodiments, such an action can include a memory device driving DMI to the second level to indicate that test pattern values latched on CA[3:0] inputs are available as output data on DQ bus.

FIGS. 30A to 30C are diagrams comparing performance of a memory device according to an embodiment, to conventional memory solutions.

FIG. 30A is a timing diagram showing consecutive read operations for a conventional x8 LPDDR4 SDRAM. The operations can be considered "LPDDR x8" type operations. The operations can occur with a clock speed of 800 MHz, with each read operation accessing 32 bytes of data. Read data are output at a double data rate, and so will provide 2 bytes per clock cycle over 16 clocks. The SDRAM can have a tRCD value of 18 ns (i.e., 16 clocks), and a RL of 14 clocks. FIG. 30A includes waveforms for CS, CA 6 (i.e., a 6-bit command-address bus), a latency corresponding to a first read command (Lat1), a latency corresponding to a second read command (Lat2), and DQ 8 (i.e., an 8-bit DQ IO bus).

Referring still to FIG. 30A, each read command can include two activation commands (ACT1/ACT2) followed by a read command and CAS command (RD/CAS). The RD/CS commands can be received after a delay of tRCD. Read data will be output following a RL after the CAS command. The read operations are timed to provide back to back bursts, each of 16 clocks, and each providing 32 bytes of data.

FIG. 30B is a timing diagram showing consecutive read operations for memory device according to an embodiment. The operations can be considered "LPDDR x4" operations. A memory device may be a DRAM, a nonvolatile memory (e.g., NOR flash), or combination thereof. The operations can include timing like that of FIG. 30A, including a clock speed of 800 MHz, a tRCD of 16 clocks, and a RL of 14 clocks. However, the operation of FIG. 30B includes a reduced CA bus of 3-bits and reduced DQ bus of 4-bits. Consequently, while each read operation accesses 32 bytes of data, as in FIG. 30A, read operations will provide 1 byte per clock cycle over 32 clocks. FIG. 30B includes waveforms for CS, CA 3 (i.e., a 3-bit command-address bus), Lat1, Lat2, and DQ 4 (i.e., a 4-bit DQ IO bus).

Referring still to FIG. 30B, the same commands can be processed as in the case of FIG. 30A, however, because of CA 3, commands can be received over four cycles instead of two. The read operations are timed to provide back to back bursts, each of 32 clocks, and each providing 32 bytes of data.

FIG. 30C is a table comparing performance of conventional devices to that of the LPDDR x4 embodiment shown in FIG. 30B. FIG. 30C includes parameters tCK (clock speed); pin count; usable bandwidth (estimated rate at which data can be transmitted); and signaling (the type of IO signaling used). Parameters for a HBM x16 memory, LPDDR x8 and the LPDDR x4 embodiment are included in the table. As shown, the LPDDR x4 embodiment can provide high performance with a low pin count (12).

Figure 31:
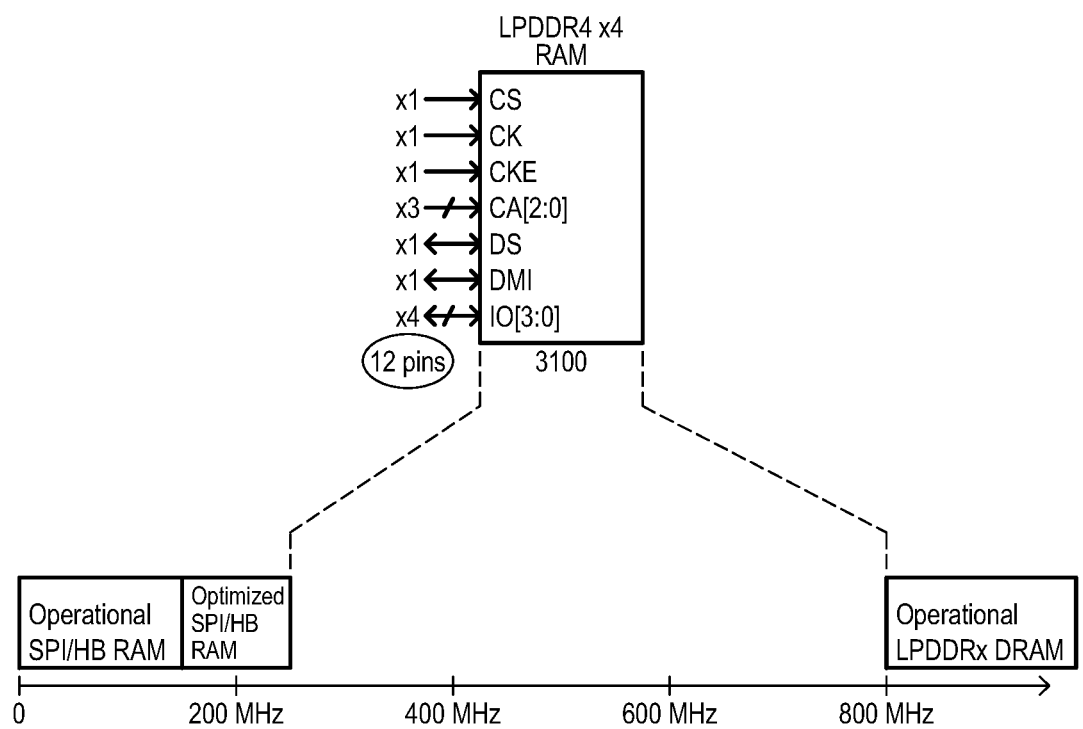
FIG. 31 is a diagram showing applications of memory devices according to embodiments.

FIG. 31 is a diagram showing how a high-performance, reduced pin count memory devices 3100 according to embodiments (e.g., LPDDR4 x4 RAM) can serve as a solution between conventional devices having higher pin counts and/or lower performance.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:
1. A method, comprising:
  in an integrated circuit device:
    at a unidirectional command-address (CA) bus having no more than four parallel inputs, receiving a sequence of no less than three command value portions;
    latching each command value portion in synchronism with rising edges of a timing clock;
    determining an input command from the sequence of no less than three command value portions;
    executing the input command in the integrated circuit device; and
    on a bi-directional data bus having no more than six data input/outputs (IOs), outputting and inputting sequences of data values in synchronism with rising and falling edges of a data timing clock.

2. The method of claim 1, wherein:
receiving the sequence of command value portions includes receiving command value portions of three bits on four consecutive cycles of the timing clock to form a command of twelve bits.

3. The method of claim 1, further including:
in a first portion of a training mode of operation, at a data mask inversion (DMI) IO, driving a DMI signal on the DMI IO to a predetermined value to indicate that the data bus is configured to receive input data, and
in a second portion of the training mode of operation, driving at least one data bus line to a predetermined value to indicate that other of the data bus lines are providing output data.

4. The method of claim 1, wherein:
outputting and inputting sequences of data values includes receiving and transmitting data bytes as 4-bit nibbles on consecutive rising and falling edges of a data strobe clock that is in synchronism with the timing clock.

5. The method of claim 1, further including:
in at least a first mode of operation, at a data mask inversion (DMI) IO,
driving a DMI signal to a first value to indicate a less significant nibble of an output byte, and
driving the DMI signal to a second value to indicate a more significant nibble of the output byte.

6. The method of claim 5, further including:
prior to driving the DMI IO, receiving a test pattern value on the CA bus; and
the output byte comprises the test pattern as captured by the integrated circuit device.

7. The method of claim 1, further including:
in a training mode
receiving a voltage reference value on at least the data IO, and
after receiving the voltage reference value, receiving an input training value.

8. The method of claim 7, wherein:
receiving the voltage reference value includes receiving a first portion of the voltage reference value on the data IOs followed by a second portion of the voltage reference value on the data IOs.

9. The method of claim 7, wherein:
receiving the voltage reference value includes
receiving a first portion of the voltage reference value on the CA bus, and
receiving a second portion of the voltage reference value on the data bus at the same time as the first portion.

10. An integrated circuit (IC) device, comprising:
an interface comprising
at least one clock input configured to receive a periodic timing clock;
command-address (CA) bus having no more than four parallel inputs configured to receive sequences of no less than three command value portions;
at least one chip select (CS) configured to receive a chip select signal that indicates valid CA data are on the CA bus;
a bidirectional data strobe input/output (IO) configured to output and receive a data strobe signal that is derived with the timing clock;
a bidirectional data bus having no more than six parallel IOs configured to receive data values and transmit data values in synchronism with rising and falling edges of the data strobe signal;
control circuits configured to execute commands received as no less than three command value portions on consecutive cycles of the timing clock; and
a memory cell array configured to retrieve and store data values in response to commands received on the CA bus.

11. The IC device of claim 10, wherein:
the CA bus is configured to receive command value portions of three bits; and
the control circuit is configured to execute commands received as command value portions on four consecutive cycles of the timing clock.

12. The IC device of claim 10, wherein:
the interface further includes a data mask inversion (DMI) I/O; and
the IC device further includes DMI control circuits configured to,
in a first portion of a training mode, drive a DMI signal on the DMI IO to a predetermined value to indicate the data bus is configured to receive input data, and
in a second portion of the training mode, drive at least one data IO to a predetermined value to indicate other of the data IOs is providing output data.

13. The IC device of claim 10, further including:
the interface further includes a data mask inversion (DMI) IO;
the data bus is configured to receive and transmit data bytes as 4-bit nibbles on consecutive rising and falling edges of a data strobe clock that is in synchronism with the timing clock; and
DMI control circuits configured to
drive a DMI signal on the DMI IO to a first value to indicate the less significant nibble of an output byte, and
drive the DMI signal to a second value to indicate the more significant nibble of the output byte.

14. The IC device of claim 10, further including:
training circuits configured to receive a first portion of a reference value via the CA bus, and a second portion of the reference value via the data bus; and
voltage reference circuits configured to generate a reference voltage in response to the reference value.

15. The IC device of claim 10, further including:
the control circuits are further configured to receive a first portion of a reference value via the data IOs followed by a second portion of the reference value via the data IOs; and
voltage reference circuits configured to generate a reference voltage in response to the reference value.

16. The IC device of claim 10, further including:
the interface further includes a data mask inversion (DMI) I/O; and
the IC device further includes DMI control circuits configured to, in a data mask write operation, inhibit a writing of data values received at the data IOs when a DMI signal on the DMI IO has a first value, and enable the writing of data values received at the data IOs when the DMI signal has a second value.

17. The IC device of claim 10, wherein:
the memory cell array comprises nonvolatile memory cells.

18. A system, comprising:
a first memory device comprising:
  a device interface that includes
    a clock input configured to receive a timing clock;
    command-address (CA) bus having no more than four parallel inputs configured to receive a single command over no less than three cycles of the timing clock;
    a bidirectional data bus having no more than six parallel input/outputs (IOs) configured to receive data values and transmit data values in synchronism with rising and falling edges of a data strobe signal; and
  a memory cell array configured to retrieve and store data values in response to commands received on the CA bus; and
a system bus coupled to the clock input, the CA bus, and the data bus.

19. The system of claim 18, wherein:
the first memory device is configured
  to receive commands on the CA bus as a sequence of three bit data values over the four cycles, and
  to receive and transmit data on the data bus in sequences of four bit nibbles.

20. The system of claim 18, further including:
a host device coupled to the system bus and configured to issue a command for at least the first memory device as a sequence of four, three-bit command value portions.

21. The system of claim 18, wherein:
the host device is configured to, in a training mode of operation,
  issue test pattern data for receipt on the CA bus of the first memory device,
  receive the test pattern data as received by the first memory device from the first memory device, and
  adjust a timing for issuing data on the CA bus.

22. The system of claim 18, further including:
the memory cell array of the first memory device comprises nonvolatile memory cells; and
a second memory device coupled to the system bus comprising a volatile memory cell array.

23. The system of claim 18, wherein:
the first memory device further includes a serial interface configured to transmit serial data on a serial data bus in synchronism with a serial clock; and
the host device is coupled to the serial data bus.

* * * * *